US006906780B1

(12) United States Patent
Smith

(10) Patent No.: US 6,906,780 B1
(45) Date of Patent: Jun. 14, 2005

(54) METHOD AND APPARATUS FOR SELF-REFERENCED DYNAMIC STEP AND SCAN INTRA-FIELD LENS DISTORTION

(75) Inventor: Adlai Smith, Escondido, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 10/252,020

(22) Filed: Sep. 20, 2002

Related U.S. Application Data
(60) Provisional application No. 60/323,571, filed on Sep. 20, 2001.

(51) Int. Cl.[7] .......................... G03B 27/68; G03B 27/42
(52) U.S. Cl. .......................... 355/52; 355/53
(58) Field of Search ............................ 355/52, 53, 55, 355/67, 77; 356/124, 399–401; 250/548, 559.4

(56) References Cited

U.S. PATENT DOCUMENTS

| | | | |
|---|---|---|---|
| 4,861,148 A | 8/1989 | Santo et al. ................. | 350/505 |
| 5,285,236 A | 2/1994 | Jain ............................ | 355/53 |
| 5,402,224 A | 3/1995 | Hirukawa et al. ........... | 356/124 |
| 5,438,413 A | 8/1995 | Mazor et al. ................ | 356/363 |
| 5,615,006 A | 3/1997 | Hirukawa et al. ........... | 356/124 |
| 5,757,507 A | 5/1998 | Ausschnitt et al. .......... | 356/401 |
| 5,877,861 A | 3/1999 | Ausschnitt et al. ......... | 356/401 |
| 5,894,350 A | 4/1999 | Hsieh et al. ................. | 356/399 |
| 6,079,256 A | 6/2000 | Bareket ....................... | 73/105 |
| 6,143,621 A | 11/2000 | Tzeng et al. ................ | 438/401 |
| 6,153,886 A | 11/2000 | Hagiwara et al. ........... | 250/548 |
| 6,204,912 B1 | 3/2001 | Tsuchiya et al. ............. | 355/53 |
| 6,259,525 B1 | 7/2001 | David ......................... | 356/399 |
| 6,356,343 B1 * | 3/2002 | Shiraishi et al. ............. | 355/77 |
| 6,563,573 B1 * | 5/2003 | Morohoshi et al. ......... | 356/124 |
| 6,573,986 B2 * | 6/2003 | Smith et al. ................. | 356/124 |
| 2002/0071112 A1 | 6/2002 | Smith et al. ................. | 356/124 |

OTHER PUBLICATIONS

Lin, B.J., "The Attenuated Phase–Shifting Mask", Solid State Technology, Special Series/Advanced Lithography, 35(1):43–47, (Jan., 1992).
Armitage et al., "Analysis of Overlay Distortion Patterns", SPIE, 921:207–221 (1988).
Bjorkholm et al., "Reduction Imaging at 14 nm Using Multilayer–Coated Optics: Printing of Features Smaller than 0.1 $\mu$m", J. Vac. Sci. Technol. B., 8(6):1509–1543 (1990).
Bruning et al., "Optical Lithography—Thirty Years and Three Orders of Magnitude", SPIE, 3051:14–27 (1997).
Brunner, T.A., "Impact of Lens Aberrations on Optical Lithography", IBM J. Res. and Devel.: Optical Lithography, 41(1–2):57–67 (1997). Reprint submitted, pp. 1–27.
Cote et al., "Micrascan™ III–Performance of a Third Generation, Catadioptric Step and Scan Lithographic Tool", SPIE, 3051:806–816 (1997).
DeJule, R., "Mix and Match: A Necessary Choice", Semiconductor International, 23(2):66–76 (2000).
Dooly et al., "Stepper Matching for Optimum Line Performance", SPIE, 3051:426–432 (1997).
Goodwin et al., "Characterizing Overlay Registration of Concentric 5X and 1X Stepper Exposure Fields Using Interfield Data", SPIE, 3050:407–417 (1997).
Handbook of Microlithography, Micromachining and Microfabrication, Book: vol. 1, "Microlithography", Rai–Choudhury, P. (Ed.)., SPIE Optical Engineering Press, SPIE, Bellingham, Washington, pp. 417–418 (1997).

(Continued)

Primary Examiner—Henry Hung Nguyen

(57) ABSTRACT

A reticle consisting of a 2-dimensional array of standard overlay targets is exposed several times onto a photoresist coated silicon wafer using a photolithographic scanner. Next, the overlay targets are measured for placement error using a conventional overlay metrology tool. The resulting overlay error data is then fed into a software program that generates the lens contribution to the intra-field error map for the photolithographic projection scanning system.

25 Claims, 16 Drawing Sheets

OTHER PUBLICATIONS

Hasan et al., "Automated Electrical Measurements of Registration Errors in Step–and–Repeat Optical Lithography Systems", *IEEE Transactions on Electron Devices, ED27(12)*:2304–2312 (1980).

Kemp et al., "A 'Golden Standard' Wafer Design for Optical Stepper Characterization", *SPIE, 1464*:260–266 (1991).

KLA 5105, "Linewidth and Misregistration System", KLA 5105 Product Specification, *KLA Instruments Corporation*, 2 pages (1995).

KLA 5200, "Value–added Overlay Metrology for Advanced Lithography", KLA 5200 Product Specifications, *KLA Instruments Corporation*, 2 pages, (1996).

Kodama et al., "Measuring System XY–5i", *SPIE, 2439*:144–155 (1995).

Leica LMS IPRO, "Fully Automated Mask and Wafer Metrology System", *Leica*, pamphlet pp. 1–5.

MacMillen et al., "Analysis of Image Field Placement Deviations of a 5X Microlithographic Reduction Lens", *SPIE, 334*:78–89 (1982).

Martin et al., "Measuring Fab Overlay Programs", *SPIE, 3677*:64–71 (1999).

McFadden et al., "A Computer Aided Engineering Workstation for Registration Control", *SPIE, 1087*:255–266 (1989).

Mulkens et al., "ArF Step and Scan Exposure System for 0.15 µm Technology Node?", *SPIE, 3679*:506–521 (1999).

Newnam et al., "Development of XUV Projection Lithograph at 60–80 nm", *SPIE, 1671*:419–436 (1992).

*Numerical Recipes*, "The Art of Scientific Computing", Press et al., (Eds.), Cambridge University Press, New York, pp. 52–64 (1990).

Pellegrini, J.C., "Comparisons of Six Different Intrafield Control Paradigms in an Advanced Mix–and–Match Environment", *SPIE, 3050*:398–406 (1997).

Pellegrini et al., "Super Sparse Overlay Sampling Plans: An Evaluation of Methods and Algorithms for Optimizing Overlay Quality Control and Metrology Tool Throughput", *SPIE, 3677*:72–82 (1999).

Preil et al., "A New Approach to Correlating Overlay and Yield", *SPIE, 3677*:208–216 (1999).

Quaestor Q7, "Fully Automated Optical Metrology System for Advanced IC Production", Quaestor Q7 Product Specification, *BIO–RAD*, 2 pages.

Raugh, M.R., "Error Estimation for Lattice Methods of State Self–Calibration", *SPIE, 3050*:614–625 (1997).

Sullivan, N.T., "Semiconductor Pattern Overlay", *SPIE Critical Reviews of Optical Science and Technology, CR52*:160–188 (1994).

Takac et al., "Self–Calibration in Two–Dimensions: The Experiment", *SPIE, 2725*:130–146 (1996).

van den Brink et al., "Direct–Referencing Automatic Two–Points Reticle–to–Wafer Alignment Using a Projection Column Servo System", *SPIE, 633*:60–71 (1986).

van den Brink et al., "Matching Management of Multiple Wafer Steppers Using a Stable Standard and a Matching Simulator", *SPIE, 1087*:218–232 (1989).

van den Brink et al., "Matching of Multiple Wafer Steppers for 0.35 µm Lithography Using Advanced Optimization Schemes", *SPIE, 1926*:188–207 (1993).

van den Brink et al., "Matching Performance for Multiple Wafer Steppers Using an Advanced Metrology Procedure", *SPIE, 921*:180–197 (1988).

van den Brink et al., "New 0.54 Aperture i–Line Wafer Stepper with Field by Field Leveling Combined with Global Alignment", *SPIE, 1463*:709–724 (1991).

van Schoot et al., "0.7 NA DUV Step & Scan System for 150nm Imaging with Improved Overlay", *SPIE, 3679*:448–463 (1999).

Yost et al., "Lens Matching and Distortion Testing in a Multi–Stepper, Sub–Micron Environment", *SPIE, 1087*:233–244 (1989).

Zavecz et al., "Life Beyond Mix–and–Match: Controlling Sub–0.18 µm Overlay Errors" *Semiconductor International, 23(8)*:205,206,208,210,212 and 214 (2000).

Zavecz, T.E., "Machine Models and Registration", *SPIE Critical Reviews of Optical Science and Technology, CR52*:134–159 (1994).

* cited by examiner

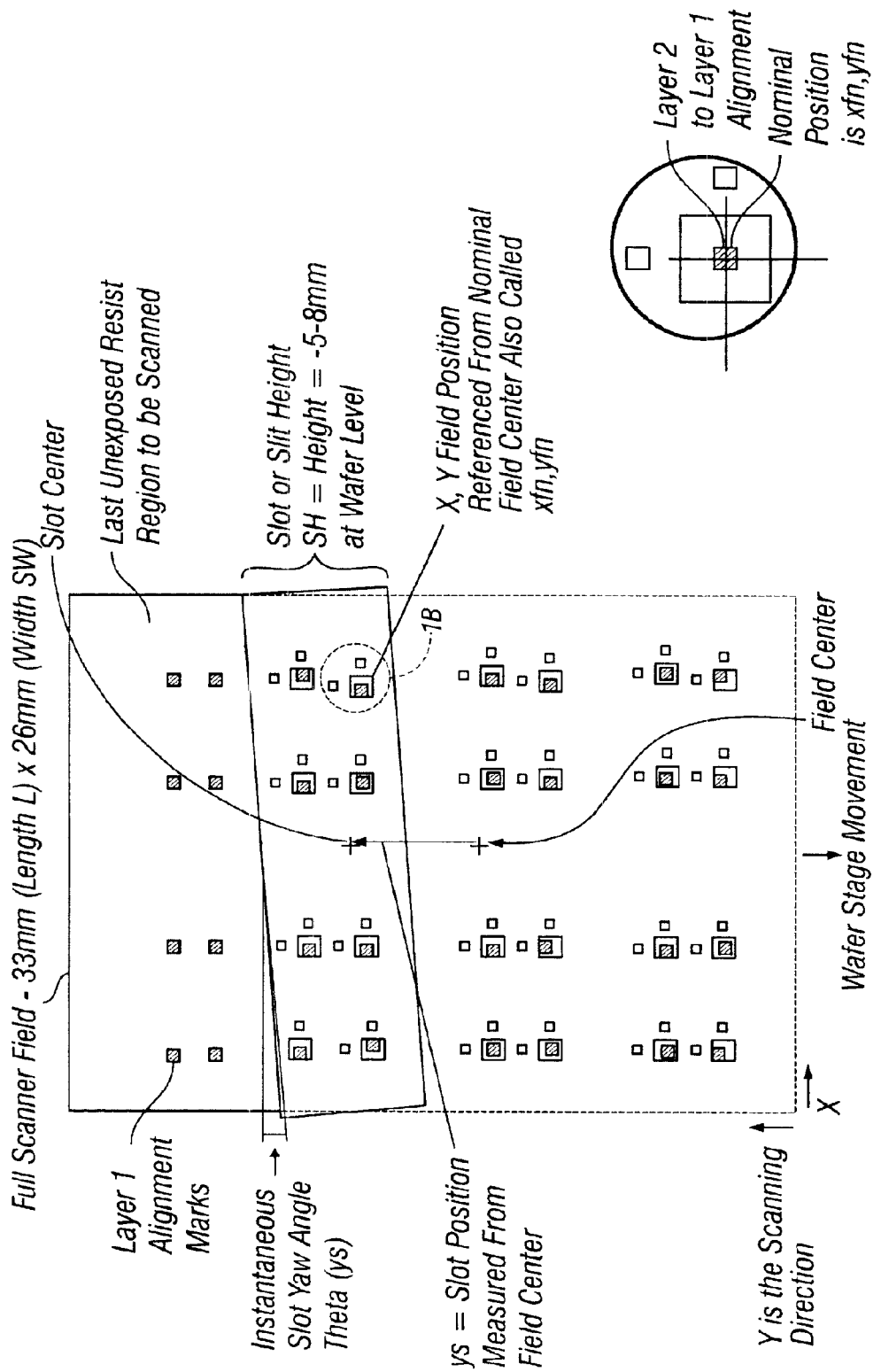

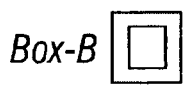  
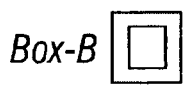 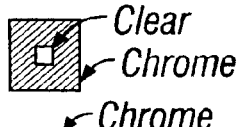 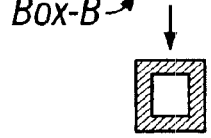
FIG. 3    FIG. 4    FIG. 5
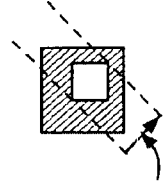 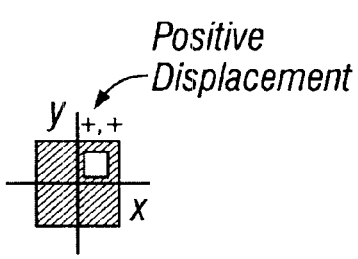
FIG. 6
 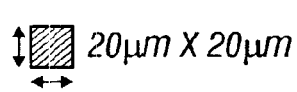 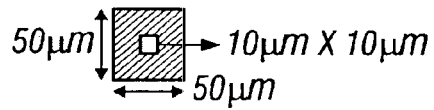
FIG. 7    FIG. 8    FIG. 9    FIG. 10
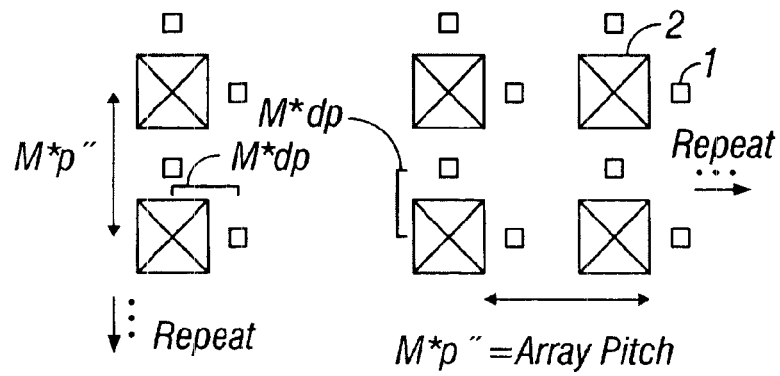
FIG. 11

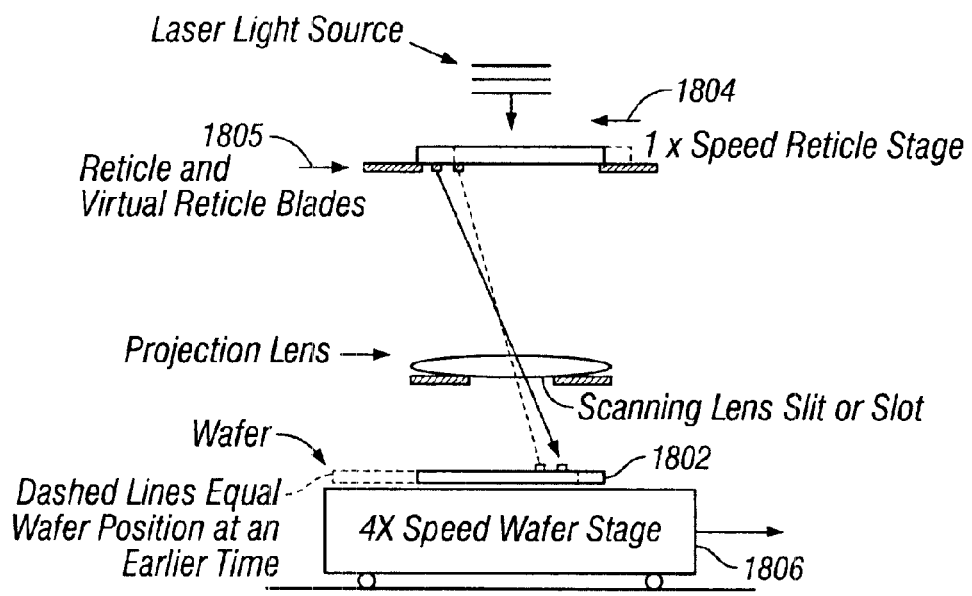
FIG. 18
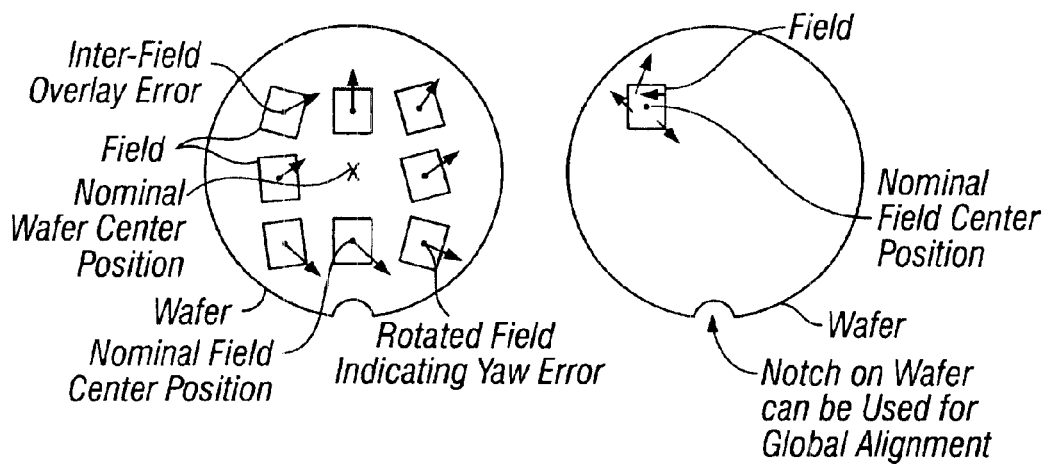
FIG. 19  FIG. 20

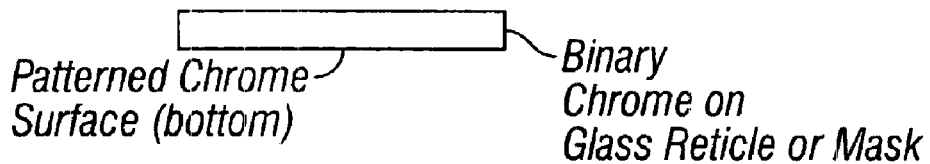
FIG. 22
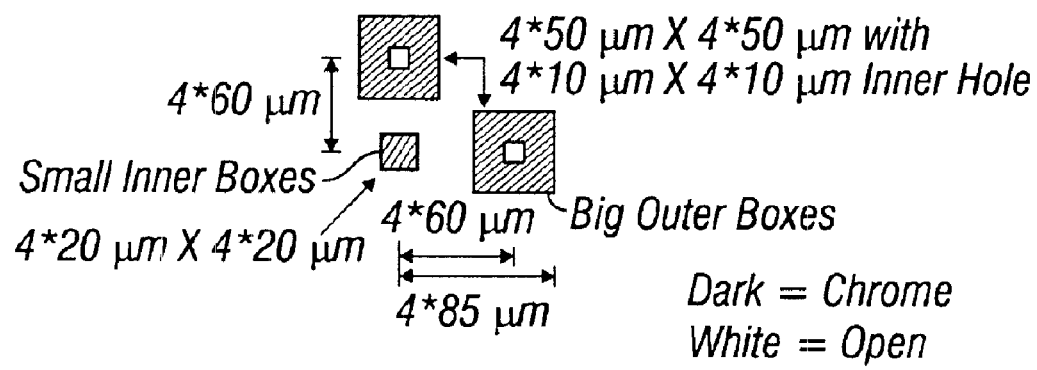
FIG. 23
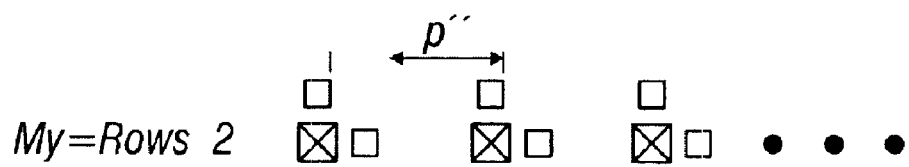
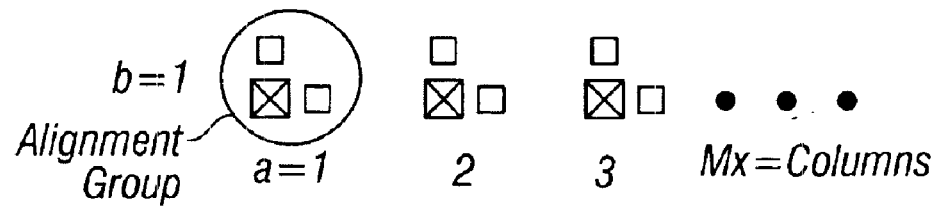
FIG. 24

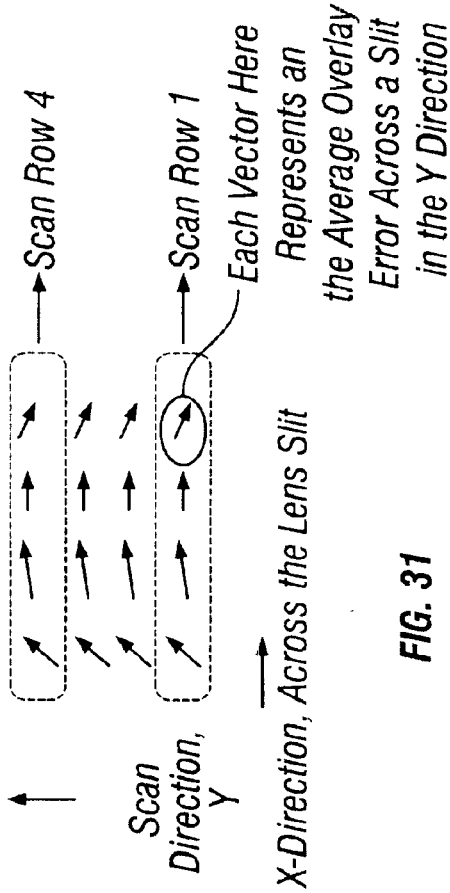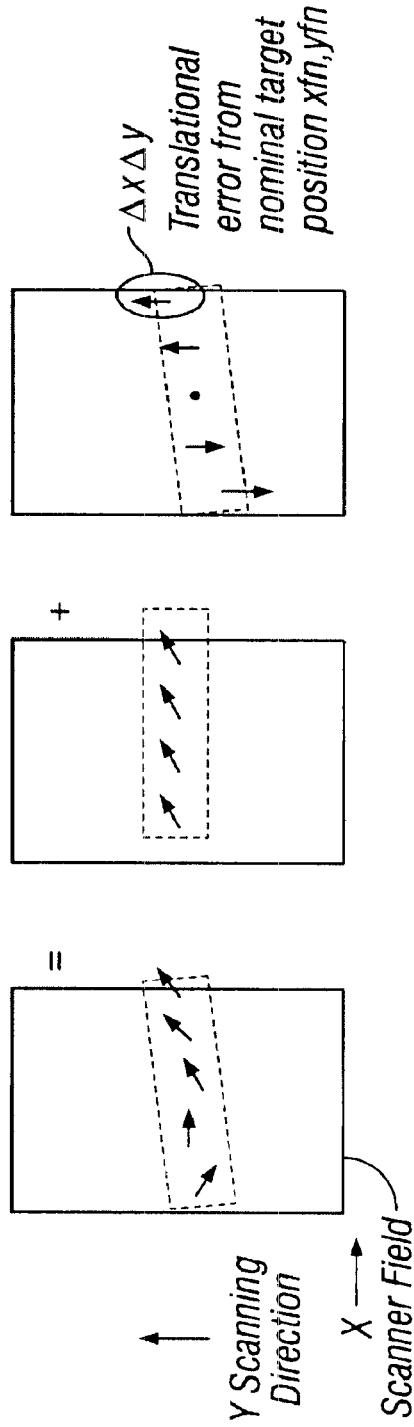
FIG. 31
FIG. 32
FIG. 33
FIG. 34

Machine id: DUVF11-02

| xfn | $\Delta xL(xfn)$ | $\Delta yL(xfn)$ |
|---|---|---|
| -10000.000 | -0.139 | 0.044 |
| -8000.000 | 0.223 | -0.233 |
| -6000.000 | 0.498 | 0.004 |
| ⋮ | ⋮ | ⋮ |
| 10000.000 | 0.099 | -0.188 |

FIG. 37

METHOD AND APPARATUS FOR SELF-REFERENCED DYNAMIC STEP AND SCAN INTRA-FIELD LENS DISTORTION

REFERENCE TO PRIORITY DOCUMENT

This application claims the benefit of priority of co-pending U.S. Provisional Patent Application Ser. No. 60/323,571, entitled "Method for Self-Referenced Dynamic Step and Scan Intra-Field Lens Distortion", by Adlai Smith, filed Sep. 20, 2001. Priority of the filing date of Sep. 20, 2001 is hereby claimed, and the disclosure of the Provisional patent application is hereby incorporated by reference.

BACKGROUND OF THE INVENTION

1. Field of the Invention

The present invention relates generally to optical metrology and more particularly to characterizing and monitoring intra-field distortions of projection imaging systems used in semiconductor manufacturing.

2. Description of the Related Art

Today's lithographic processing requires ever tighter layer-to-layer overlay tolerances to meet device performance requirements. Overlay registration is defined as the translational error that exists between features exposed layer to layer in the vertical fabrication process of semiconductor devices on silicon wafers. Other names for overlay registration include, registration error and pattern placement error, and overlay error. Overlay registration on critical layers can directly impact device performance, yield and repeatability. Increasing device densities, decreasing device feature sizes and greater overall device size conspire to make pattern overlay one of the most important performance issues during the semiconductor manufacturing process. The ability to accurately determine correctable and uncorrectable pattern placement error depends on the fundamental techniques and algorithms used to calculate lens distortion, stage error, and reticle error.

A typical microelectronic device or circuit may consist of 20–30 levels or pattern layers. The placement of pattern features on a given level must match the placement of corresponding features on other levels, i.e., overlap, within an accuracy which is some fraction of the minimum feature size or critical dimension (CD). Overlay error is typically, although not exclusively, measured with a metrology tool appropriately called an overlay tool using several techniques. See for example, Semiconductor Pattern Overlay, N. Sullivan, SPIE Critical Reviews Vol. CR52, 160:188. The term overlay metrology tool or overlay tool means any tool capable of determining the relative position of two pattern features or alignment attributes, that are separated within 500 um (microns) of each other. The importance of overlay error and its impact to yield can be found elsewhere. See Measuring Fab Overlay Programs, R. Martin, X. Chen, I. Goldberger, SPIE Conference on Metrology, Inspection, and Process Control for Microlithography XIII, 64:71, March, 1999; New Approach to Correlating Overlay and Yield, M. Preil, J. McCormack, SPIE Conference on Metrology, Inspection, and Process Control for Microlithography XIII, 208:216, March 1999.

Lithographers have created statistical computer algorithms (for example, Klass II and Monolith) that attempt to quantify and divide overlay error into repeatable or systematic and non-repeatable or random effects. See Matching of Multiple Wafer Steppers for 0.35 Micron Lithography Using Advanced Optimization Schemes, M. van den Brink, et al., SPIE Vol. 1926, 188:207, 1993; A Computer Aided Engineering Workstation for Registration Control, E. McFadden, C. Ausschnitt, SPIE Vol. 1087, 255:266, 1989; Semiconductor Pattern Overlay, supra; Machine Models and Registration, T. Zavecz, SPIE Critical Reviews Vol. CR52, 134:159. An overall theoretical review of overlay modeling can be found in Semiconductor Pattern Overlay, supra.

Overlay error is typically divided into the following two major categories. The first category, inter-field or grid overlay error, is concerned with the actual position of the translation and rotation, or yaw, of the image field as recorded in the photoresist on a silicon wafer using an exposure tool, i.e., stepper or scanner. Translation is referenced from the nominal center of the wafer while yaw is referenced with respect to the nominal center at each field. See FIG. 19. The alignment of the device pattern on the silicon wafer depends on the accuracy of the stepper or scanner wafer stage, reticle stage and any interaction between them.

The second category, intra-field overlay error, is the positional offset of an individual point inside a field referenced to the nominal center of an individual exposure field, as illustrated in FIG. 20. The term "nominal center" means the machine programmed stepping position. Intra-field overlay errors are generally related to lens aberrations or distortions, scanning irregularities, and reticle alignment. It is common practice to make certain assumptions concerning the magnitude and interaction of stage error and lens distortion error in modern overlay algorithms that calculate lens distortion. The common rule is: "trust the accuracy of the stage during the creation of the overlay targets by making the simple assumption that only a small amount of stage error is introduced and can be accounted for statistically". See A "Golden Standard" Wafer Design for Optical Stepper Characterization, K. Kenp et al., SPIE Vol. 1464, 260:266, 1991; Matching Performance for Multiple Wafer Steppers Using an Advanced Metrology Procedure, M. Van den Brink, et al., SPIE Vol. 921, 180:197, 1988. When applied to measurements of intra-field distortion this technique is called stage metered measurement of lens distortion.

It is important for this discussion to realize that most overlay measurements are made on silicon product wafers after each photolithographic process, prior to final etch. Product wafers cannot be etched until the resist target patterns are properly aligned to the underlying target patterns. See Super Sparse Overlay Sampling Plans: An Evaluation of Methods and Algorithms for Optimizing Overlay Quality Control and Metrology Tool Throughput, J. Pellegrini, SPIE Vol. 3677, 72:82. Manufacturing facilities rely heavily on exposure tool alignment and calibration procedures to help insure that the stepper or scanner tools are aligning properly; See Stepper Matching for Optimum Line Performance, T. Dooly et al., SPIE Vol. 3051, 426:432, 1997; Mix-and-Match: A Necessary Choice, R. DeJule, Semiconductor International, 66:76, February, 2000; Matching Performance for Multiple Wafer Steppers Using an Advanced Metrology Procedure, supra. Inaccurate overlay modeling algorithms can corrupt the exposure tool calibration procedures and degrade the alignment accuracy of the exposure tool system. See Super Sparse Overlay Sampling Plans: An Evaluation of Methods and Algorithms for Optimizing Overlay Quality Control and Metrology Tool Throughput, supra.

Over the past 30 years the microelectronics industry has experienced dramatic rapid decreases in critical dimension by constantly improving photolithographic imaging systems. Today, these photolithographic systems are pushed to performance limits. As the critical dimensions of semiconductor devices approach 50 nm the overlay error requirements will soon approach atomic dimensions. See Life Beyond Mix-and-Match: Controlling Sub-0.18 micron Overlay Errors, T. Zavecz, Semiconductor International, July, 2000. To meet the needs of next generation device specifications new overlay methodologies will need to be developed. In particular, overlay methodologies that can accurately separate out systematic and random effects and break them into assignable causes will greatly improve device process yields. See A New Approach to Correlating Overlay and Yield, supra.

In particular, those new overlay methodologies that can be implemented into advanced process control or automated control loops will be most important. See Comparisons of Six Different Intra-field Control Paradigms in an Advanced Mix and Match Environment, J. Pellegrini, SPIE Vol. 3050, 398:406, 1997; Characterizing Overlay Registration of Concentric 5x and 1xStepper Exposure Fields Using Inter-Field Data, F. Goodwin et al., SPIE Vol. 3050, 407:417, 1997. Finally, another area where quantifying lens distortion error is of vital concern is in the production of photomasks or reticles during the electron beam manufacturing process. See Handbook of Microlithography and Microfabrication, P. Rai-Choudhury, Vol.1, pg. 417, 1997.

Semiconductor manufacturing facilities generally use some version of the following complex overlay procedure to help determine the magnitude of intra-field distortion independent of other sources of systematic overlay error for both photolithographic steppers and scanners. The technique has been simplified for illustration. See Analysis of Image Field Placement Deviations of a 5×Microlithographic Reduction Lens, D. MacMillen et al., SPIE Vol. 334, 78:89, 1982. FIGS. 3 and 4 show typical sets of overlay targets, including one large or outer box and one small or inner target box. FIG. 1 shows a typical portion of a distortion test reticle used in the prior art. It should be noted that the chrome target patterns on most reticles are 4 or 5 times larger as compared with the patterns they produce at the image plane, this simply means modern stepper and scan systems (scanners) are reduction systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, in FIG. 2a is exposed onto the resist-coated wafer in FIG. 25. For purposes of illustration, we assume that the distortion test reticle consists of a 5×5 array of outer boxes evenly spaced a distance M*P, across the reticle surface. See FIG. 2a. It is typically assumed that the center of the optical system is virtually aberration free. See Analysis of Image Field Placement Deviations of a 5× Microlithographic Reduction Lens, supra. With this assumption, the reticle, in FIG. 2a, is now partially covered using the reticle blades, See FIG. 18, in such a way that only a single target at the center of the reticle field, box A, in FIG. 2a, is available for exposure. Next, the wafer stage is moved in such a way as to align the center of the reticle pattern directly over the upper left hand corner of the printed 5×5 outer box array, wafer position 1, FIG. 25. The stepper then exposes the image of the small target box onto the resist-coated wafer. If the wafer stage, optical system, and scanning dynamics were truly perfect then the image of the small target box would fit perfectly inside the image of the larger target box from the previous exposure, as illustrated in FIGS. 5, 6, and 25.

At this point the stepper and wafer stage are programmed to step and expose the small target box in the 5×5 array where each exposure is separated from the previous one by the stepping distance P. With the assumption of a perfect stage, the final coordinates of the small target boxes are assumed to form a perfect grid, where the spacing of the grid is equal to the programmed stepping distance, P. Finally, if the first full-field exposure truly formed a perfect image, then the entire 5×5 array of smaller target boxes would fit perfectly inside the 5×5 array of larger target boxes as illustrated in FIG. 6. Since the first full-field exposure pattern is in fact distorted due to an imperfect imaging system, and scanner system, the actual position of the larger target box will be displaced relative to the smaller target boxes for example, as shown in FIG. 6. The wafer is then sent through the final few steps of the photographic process to create the final resist patterned overlay targets. The intra-field overlay error at each field position can be measured with a standard optical overlay tool. Using the models described below, in Equations 1 and 2, the overlay data is analyzed and the lens distortion error is calculated.

The following inter-field and intra-field modeling equations are commonly used to fit the overlay data using a least square regression technique. See Analysis of Image Field Placement Deviations of a 5× Microlithographic Reduction Lens, supra; Super Sparse Overlay Sampling Plans: An Evaluation of Methods and Algorithms for Optimizing Overlay Quality Control and Metrology Tool Throughput, supra.

$$dxf(xf,yf)=Tx+s*xf-q*yf+t1*xf^2+t2*xf*yf-E*(xf^3+xf*yf^2) \quad \text{(eq 1)}$$

$$dyf(xf,yf)=Ty+s*yf+q*xf+t2*yf^2+t1*xf*yf-E*(yf^3+yf*xf^2) \quad \text{(eq 2)}$$

where
(xf,yf)=intra-field coordinates
(dxf, dyf)(xf,yf)=intra-field distortion at position (xf, yf)
(Tx, Ty)=(x,y) intra-field translation
s=intra-field overall scale or magnification
q=intra-field rotation
(t1, t2)=intra-field trapezoid error
E=intra-field lens distortion.

A problem with the this technique is two-fold, first, it is standard practice to assume that the wafer stage error is very small, randomly distributed, and can be completely accounted for using a statistical model. See Analysis of Image Field Placement Deviations of a 5× Microlithographic Reduction Lens, supra; A "Golden Standard" Wafer Design for Optical Stepper Characterization, supra; Matching Management of Multiple Wafer Steppers Using a Stable Standard and a Matching Simulator, M. Van den Brink et al., SPIE Vol. 1087, 218:232, 1989; Matching Performance for Multiple Wafer Steppers Using an Advanced Metrology Procedure, supra. In general, positional uncertainties in the wafer stage introduce both systematic and random errors, and since the intra-field is measured only in reference to the lithography tool's wafer stage, machine to machine wafer stage differences show up as inaccurate lens distortion maps. Secondly, the assumption that lens distortion is zero at the center of the lens is incorrect. Furthermore, the model represented by Equations 1 and 2 is entirely unsuited to modeling scanner scale overlay errors—typically the intra-field distortion model accounts only for the scanner skew and scanner scale overlay errors—in general, the synchronization errors between the reticle stage and wafer stage introduce more complex errors described below.

A technique for stage and 'artifact' self-calibration is described in See Self-Calibration in Two-Dimensions: The Experiment, M. Takac, et al., SPIE Vol. 2725, 130:146, 1996; Error Estimation for Lattice Methods of Stage Self-Calibration, M. Raugh, SPIE Vol. 3050, 614:625, 1997. It consists of placing a plate (artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its' initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor. A drawback to this technique is that it requires that the measurements be performed on the same machine that is being assessed by this technique. Furthermore, this technique requires measurements made on a tool in absolute coordinates; the metrology tool measures the absolute position of the printed targets relative to its own nominal center; so absolute measurements are required over the entire imaging field (typical size greater than about 100 mm$^2$).

Another technique for the determination of intra-field distortion is the method of A. H. Smith et al. ("Method And Apparatus For Self-Referenced Projection Lens Distortion Mapping", U.S. patent application Ser. No. 09/835,201, filed Apr. 13, 2001). It is a self-referencing technique that can be utilized with overlay metrology tools in a production environment. For diagnosing the intra-field scanner distortion in the presence of significant scanner non-repeatability, this technique teaches the use of a special reticle that has reduced optical transmission that is multiply scanned producing sub-Eo exposures on the wafer. This technique can be used to accurately determine the repeatable part of the scanner intra-field distortion but not that part of the intra-field distortion that changes from scan to scan (a simple example of which is the scanner y-magnification).

Another drawback to these techniques to determine the intra-field error is that they use the scanner itself as the metrology tool. Due to the cost of scanners, which can exceed 10 million dollars, it is desirable to have a technique for intra-field error that does not use the scanner itself as the metrology tool for determining intra-field distortion but utilizes relatively inexpensive overlay metrology tools. Furthermore, it is desirable that the technique be easy to perform and thereby allowing it to be used in a production environment by the day-to-day operating personnel. It is further desirable to have a technique that can distinguish between the non-repeatable parts of the scanner intra-field distortion.

Other references discuss aspects of intra-field distortion include: New 0.54 Aperture I-Line Wafer Stepper with Field by Field Leveling Combined with Global Alignment, M. Van den Brink et al., SPIE Vol. 1463, 709:724, 1991; Impact of Lens Aberrations on Optical Lithography, T. Brunner; Lens Matching and Distortion Testing in a Multi-Stepper, SubMicron Environment; A. Yost et al., SPIE Vol. 1087, 233:244, 1989; The Attenuated Phase Shift Mas, B. Lin; Projection Optical System for Use in Precise Copy, T. Sato et al., U.S. Pat. No. 4,861,148, Aug. 29, 1989; Method of Measuring Bias and Edge Overlay Error for Sub 0.5 Micron Ground Rules, C. Ausschnitt et al., U.S. Pat. No. 5,757,507, May 26, 1998.

Therefore there is a need for an effective, and efficient, way to determine the scanner intra-field distortion or translation errors of a projection system.

SUMMARY OF THE INVENTION

A method and apparatus, in accordance with the invention that decomposes a scanner intra-field distortion or translational error into a lens component, dependent only on the projection imaging objective or projection system aberrations and a scanning component, dependent only on the relative dynamics of the wafer and reticle scanning motion. The lens component is repeatable and depends only on the cross scan coordinate x. The scanning component consists of a translation and rotation that is a constant for each row (constant y coordinate) of the scan but varies from row to row (different y values) over the scanning length. This scanning component contains both repeatable and non-repeatable parts.

Because of the structure of the intra-field distortion the lens component which we also refer to as the dynamic lens distortion can be extracted. An overlay reticle consisting of an Mx×My set of overlay groups is exposed on 2 rows. Next, the wafer is shifted by one overlay group and the reticle blinded down to expose only a single row; the resulting exposed row forms the X-shear. Next, the wafer is rotated by 180 degrees, the reticle bladed down to a single row, and the remaining row exposed; the resulting exposed row forms the R-shear. The X and R shear rows are then measured on an overlay tool and the results sent to a software program that calculates the dynamic lens distortion. The final result of the method of this invention is a file consisting of the dynamic lens distortion at a number of discrete points perpendicular to the scanning direction.

Additional applications of the above outlined procedure include; improved lithographic simulation using conventional optical modeling software, advanced process control in the form of feedback loops that automatically adjust the projection lens for optimum performance and finally reticle correction algorithms that compensate for lens aberration. The software algorithm and technique form a self-referencing methodology.

Other features and advantages of the present invention should be apparent from the following description of the preferred embodiment, which illustrates, by way of example, principles of the invention.

BRIEF DESCRIPTION OF THE DRAWINGS

FIG. 1a is a schematic of a typical scanner exposure field and the coordinate system used for calculation purposes.

FIG. 1b shows a schematic of some typical alignment attributes—described in FIG. 12.

FIG. 3 shows a schematic version of the overlay features described in FIG. 2a.

FIG. 4 shows the actual chrome reticle patterns for the schematics in FIG. 3.

FIG. 5 shows a schematic of overlapping alignment attributes.

FIG. 6 shows the alignment attribute coordinate system and the definition of overlay error using vector notation.

FIG. 7 shows a schematic for the outer box in FIG. 2b.

FIG. 8 shows the reticle pattern for the schematic in FIG. 7 as projected onto a photoresist coated wafer.

FIG. 9 shows a schematic for the inner box in FIG. 2b.

FIG. 10 shows the reticle pattern for the schematic in FIG. 9 as projected into a photoresist coated wafer.

FIG. 11 shows a schematic of a portion of the 4XOL reticle mentioned in the preferred embodiment.

FIG. 18 shows an illustration of a typical photolithographic step and scan or scanner system.

FIG. 19 gives a visual definition of inter-field overlay error in terms of vector plots.

FIG. 20 gives a visual definition of intra-field overlay error in terms of vector plots.

FIG. 22 shows a cross-sectional view of the reticle in FIG. 21 and FIG. 2b with anti-reflective coatings.

FIG. 23 shows a detail of the overlay group on the overlay reticle shown in FIG. 21 and FIG. 2b.

FIG. 24 shows the intra-field indices for the preferred embodiment as printed on the wafer.

FIG. 31 shows a vector plot of lens distortion or overlay error in the absence of scanning synchronization error.

FIG. 32 shows a vector plot of scanning overlay errors in the absence of lens aberration/distortion.

FIG. 33 shows a vector plot of scanning transverse overlay error in the absence of lens distortion.

FIG. 34 shows a vector plot of scanning stage yaw in the absence of lens distortion.

FIG. 37 shows the final results for this invention in the form of a taped read-out.

DETAILED DESCRIPTION OF THE INVENTION

Overview

Overlay error is often referred to as registration error or pattern placement error, or simply error. Overlay error is typically classified, or divided, into the following two categories: grid or inter-field and intra-field error. Intra-field error is the overlay error in placement within a projection field, or simply field, of a lithographic projection system. Inter-field error is the overlay error from field to field on the wafer. Examples of intra-field error are illustrated in FIG. 20, and examples of inter-field errors are illustrated in FIG. 19. For photolithographic scanners the physical sources of these errors are generally distinct, with intra-field errors due to static projection lens aberrations and/or scanning dynamics while inter-field errors are due to the wafer alignment system, wafer stage and the reticle stage. An aspect described below, is determination of intra-field error produced by the lens or imaging objective optics associated with photolithographic scanners.

Figure 15:
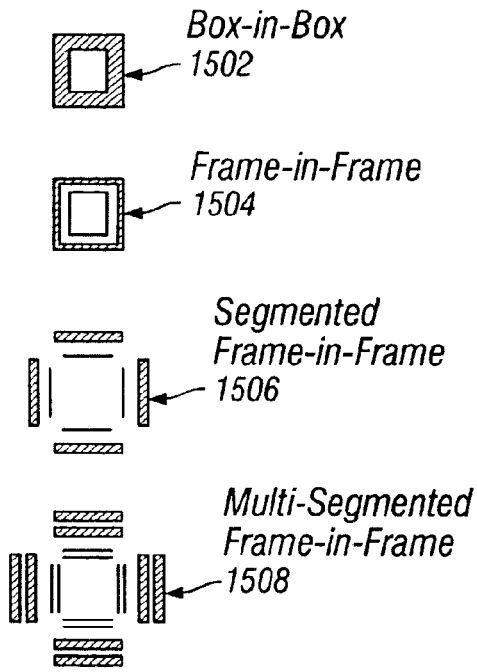
FIG. 15 shows an illustration of some typical overlay targets or alignment attributes.

In order to measure overlay error using conventional optical metrology tools, special alignment attributes or overlay target patterns See FIGS. 7–12 and 14a, can be printed or imaged onto a properly designed recording media using a photolithographic imaging system See FIG. 18. FIG. 15 shows examples of overlay target patterns, such as, box-in-box, frame-in-frame, segmented frame-in-frame, and multi-segmented frame-in-frame. FIG. 18 is a block diagram of a typical photolithographic imaging system that can be used to image the overlay target pattern onto a recording media. The recording media can include positive or negative photoresist, optically activated liquid crystals, CCD or diode imaging arrays, and photographic film. In some cases the overlay error can be measured using special in-situ exposure tool metrology. See Matching Management of Multiple Wafer Steppers Using a Stable Standard and a Matching Simulator, supra.

The deviation of the positional overlap of the alignment attributes from their nominal or machine-programmed position is the metric used to quantify overlay error. FIG. 6 shows examples of the position of alignment attributes. As shown in FIG. 6, examples of the alignment of the attribute included centered, having no error, a positive displacement, and to a transverse overlay error. As noted, there are many different kinds of alignment attributes, including, box-in-box, frame-in-frame, gratings, verniers, and electrical test structures. See Automated Electrical Measurements of Registration Errors in Step and Repeat Optical Lithography Systems, T. Hasan et al., IEEE Transactions on Electron Devices, Vol. ED-27, No. 12, 2304:2312, December 1980; Capacitor Circuit Structure for Determining Overlay Error, K. Tzeng et al., U.S. Pat. No. 6,143,621, Nov. 7, 2000; Overlay Alignment Measurement of Wafers, N. Bareket, U.S. Pat. No. 6,079,256, Jun. 27, 2000.

Examples of photolithographic scanning tools that the techniques described can be used with include, deep-UV, e-beam systems, EUV and x-ray imaging systems. See Mix-and-Match: A Necessary Choice, supra; Reduction Imaging at 14 nm Using Multiplayer-Coated Optics: Printing of Features Smaller than 0.1 Micron, J. Bjorkholm et al., Journal Vacuum Science and Technology, B 8(6), 1509:1513, November/December 1990; Development of XUV Projection Lithography at 60–80 nm, B. Newnam et al., SPIE Vol. 1671, 419:436, 1992; Optical Lithography— Thirty years and Three Orders of Magnitude, J. Bruning, SPIE Vol. 3051, 14:27, 1997. Vector displacement plots can provide a visual description of the direction, magnitude, and location of overlay error that are mathematically separated into components using variety of regression routines. FIGS. 32–34 are schematics showing an example of a vector displacement plot. Additional examples of mathematically separating overlay error into components can be found in the literature. See Analysis of Overlay Distortion Patterns, J. Armitage, et al., SPIE Vol. 921, 207:221, 1988.

As discussed above, other techniques used to measure the intra-field distortion use the projection lithography tool that is being assessed to make the measurements. An aspect of a technique in accordance with the invention is that the measurements required for determining the intra-field lens distortion can, and preferably are, made on an overlay metrology tool quite distinct from the projection lithography tool that we are assessing. In addition, some other techniques require measurements made on a tool in absolute coordinates. In these techniques the metrology tool measures the absolute position of the printed targets relative to its own nominal center, so absolute measurements are required over the entire imaging field (typical size greater than about 100 mm$^2$). An aspect of a technique in accordance with the invention uses relative coordinates or displacements of features, such as box in box structures or some other alignment attribute, that are measured with respect to each other, and the distances between these alignment attributes is typically less than about 0.5 mm. For example, in the case of box in box structures these distances are typically less than about 0.02 mm. Eliminating the need to maintain absolute position over a large area is very beneficial. For example, absolute metrology tools such as the Leica LMS 2000, Leica IPRO (See Leica LMS IPRO brochure, Leica), or Nikon 51 (See Measuring system XY-5i, K. Kodama et al., SPIE Vol. 2439, 144:155, 1995) typically cost in excess of 2 million dollars and are uncommon in semiconductor manufacturing facilities ("fabs") while overlay metrology tools such as the KLA 5200, or Bio-rad Q7 typically cost 0.5 million dollars and are widely deployed in fabs. Another drawback to using an absolute position technique is that it requires that the intra-field distortion to be repeatable from exposure to exposure, this is precluded by the scanner dynamics.

The structure of scanner intra-field distortion or translational error can be decomposed into a lens component, dependent only on the projection imaging objective or projection system objective or projection system aberrations, See FIG. 31, and a scanning component, dependent only on the relative dynamics of the wafer and reticle scanning motion See FIGS. 32–34. The lens component is repeatable but the scanning component contains both repeatable and non-repeatable parts. In addition, the lens and scanning components have certain functional forms that simplify the extraction of intra-field error. A typical photolithographic step and scan or scanner system produces an image, typically reduced 4x or 5x, of the reticle pattern in the surface of a photoresist by continuously passing exposure radiation through a small portion of the projection optics as the reticle and wafer stage travel in opposite directions. FIG. 18 is a block diagram of a typical photolithographic step and scan or scanner system. As shown in FIG. 18, a scanning reticle stage 1804 and scanning wafer stage 1806 move in opposite directions in a coordinated manner at two different speeds.

FIGS. 1a and 1b show an instantaneous (top down) view of a partially exposed scanner field (and coordinate system) as it might appear on a photoresist coated silicon wafer during a scan. Lack of coordination between the wafer stage and reticle stage in the absence of lens distortion will manifest itself as translational offset error—$\Delta T \blacklozenge (x,y,ys)$ which is defined as the instantaneous translational offset error on the wafer at intra-field position x,y—located inside the image of the lens slit—when the scanner is at position (ys). See FIG. 1a. The final distortion error or overlay error ($\Delta F \blacklozenge (x,y)$) at any point actually imaged in the photoresist is then an average of the instantaneous errors ($\Delta T \blacklozenge (x,y,ys)$), weighted by the intensity function of the scanning slit as expressed in Equation 4, where the distortion effects of the projection lens have been neglected. If the scanner operated perfectly, without synchronization or vibration errors, then the final distortion or translational error, $\Delta sL(x)$ at each field point in the photoresist would simply be the average of the static projection lens distortion $\Delta d(x)$, weighted by the intensity function of a static scanner slit expressed in Equation 5.

Thus, there are two independent sources of transverse scanning error or scanning distortion; projection lens distortion error—that varies in magnitude and direction across the scanner field (in the x direction, or perpendicular to the scanning direction) and synchronization errors that represent an average of the instantaneous (repeatable and non-repeatable) positional offsets of the wafer and reticle stage. These errors are expressed in Equations 3–13 in detail.

Because the reticle and wafer move in a coordinated manner as rigid bodies relative to one another, lack of coordination will show up as instantaneous offset errors, $(\Delta Tx, \Delta Ty) \blacklozenge (x,y,ys)$. Here $(\Delta Tx, \Delta Ty) \blacklozenge (x,y,ys)$ is the instantaneous translational offset error of the projected image at the wafer relative to a perfectly placed wafer is a function not only of the intra-field coordinate (x,y) but also of the instantaneous position, ys, of the wafer relative to the center of the scanning slit. FIG. 1a shows the relation of the full scanner field and field center relative to the slot center, this relative position is ys. For the transverse errors of the stage and reticle the instantaneous offset vector $(\Delta Tx, \Delta Ty) \blacklozenge (x,y,ys)$ will depend only on the instantaneous translational offset error ($\Delta X(ys), \Delta Y(ys)$) and the instantaneous yaw or rotational error $\theta s(ys)$ as:

$$(\Delta Tx, \Delta Ty) \blacklozenge (x,y,ys) = (\Delta X(ys) + \theta s(ys)^*(y-ys), \Delta Y(ys) - \theta s(ys)^*x) \quad \text{eq.3}$$

Another contributor to the instantaneous offset vector arises from the static distortion contribution of the projection lens. Thus if $(\square Xsl, \square Ysl) \square (x,y)$ is the static lens distortion, then its contribution to the instantaneous offset vector $(\square Tx, \square Ty)$ will be:

$$(\Delta Tx, \Delta Ty) \blacklozenge (x,y,ys) = (\Delta Xsl, \Delta Ysl) \blacklozenge (x, y-ys) \quad \text{eq.3a}$$

Lens distortion is the intra-field distortion of the scanner as determined when the wafer and reticle stages are not moved with respect to one another to produce the scanned image field. Thus, the static lens distortion does not include any contribution from synchronization or dynamic yaw errors due to the relative motion of the reticle and wafer stages. Referring to FIG. 1a, $(\Delta Xsl, \Delta Ysl) \blacklozenge (x,y)$ is defined only over the slot width (SW) 101 and slot height (SH) 102. Therefore x, y vary over the ranges $$x = (-SW/2:SW/2) \quad y = (-SH/2:SH/2) \quad \text{(eq.3b)}$$

There are various techniques for determining ($\Delta Xsl, \Delta Ysl$), a very accurate technique is described in "Method And Apparatus For Self-Referenced Projection Lens Distortion Mapping", A. H. Smith et al., U.S. patent application Ser. No. 09/835,201, filed Apr. 13, 2001. However, this and other techniques for measuring static lens distortion are not required for the techniques described below.

Combining equations 3 and 3a give the total contribution to the instantaneous offset error as:

$$(\Delta Tx, \Delta Ty) \blacklozenge (x,y,ys) = (\Delta Xsl, \Delta Ysl) \blacklozenge (x, y-ys) + (\Delta X(ys) + \theta s(ys)*(y-ys), \Delta Y(ys) - \theta s(ys)*x) \quad \text{eq 3c}$$

Here x,y vary over the entire span of intra-field coordinates;

$$x=(-SW/2:SW/2) \; y=(-L/2:L/2) \quad \text{eq.3d}$$

while ys varies over the range:

$$ys=(y-SH/2:y+SH/2) \quad \text{eq.3e}$$

since the projected image suffers a shift only when the slot (or more precisely any part of the illuminated slot) is over field position (x,y).

The effect of the projected image is then just a weighted average over the slot of the instantaneous offsets ($\Delta Tx$, $\Delta Ty$):

$$(\Delta XF, \Delta YF) \blacklozenge (x,y) = INT\{dys*w(y-ys)*(\Delta Tx, \Delta Ty) \blacklozenge (x,y,ys)\} / INT\{dys*w(y-ys)\} \quad \text{eq. 3f}$$

where;
x,y=intra-field coordinates, x=(−SW/2:SW/2), y=(−L/2:L/2)
ys=the position of the center of the scanning slit at a given instant in time referenced from the nominal die center
SW=slot width
L=scanner field length
dys=differential amount of the scanner field
INT { }=integral over the scanner field, integration range extends from ys=(−(L+SH)/2:(L+SH)/2))
w(y)=weighting function. In 248 nm resists, typically proportional to the slot intensity profile scanning slit. 0 for points outside the slit opening.
($\Delta XF$, $\Delta YF$)$\blacklozenge$(x,y)=intra-field distortion. Includes effects of scanning synchronization error and lens aberrations.

The two distinct parts of ($\Delta Tx$, $\Delta Ty$) (scanner dynamics (Equation 3) and lens distortion (Equation 3a)) are additive and therefore the intra-field distortion, ($\Delta XF$, $\Delta YF$), can also be divided up into similar parts as:

$$(\Delta XF, \Delta YF) \blacklozenge (x,y) = (\Delta xL, \Delta yL) \blacklozenge (x) + (\Delta XS(y), \Delta YS(y) - x*d\Delta YS(y)/dx) \quad \text{eq. 3g}$$

where the lens aberration contribution, ($\square xL$, $\square yL$)$\square$(x), is given by:

$$(\Delta xL, \Delta yL) \blacklozenge (x) = INT\{dys*w(y-ys)*(\Delta Xsl, \Delta Ysl) \blacklozenge (x,y-ys)\} / INT\{dys*w(y-ys)\} \quad \text{eq. 3h}$$

and the scanning dynamics contribution, ($\Delta XS(y)$, $\Delta YS(y) - x*d\Delta YS(y)/dx$), is given by:

$$(\Delta XS(y), \Delta YS(y) - x*d\Delta YS(y)/dx) = INT\{dys*w(y-ys)*(\Delta X(ys) + \theta s(ys)*(y-ys), \Delta Y(ys) - \theta s(ys)*x)\} / INT\{dys*w(y-ys)\} \quad \text{eq. 3i}$$

Identifying separate components in Equations 3h and 3i gives individual expressions for the various components of overlay error. Thus, the dynamic slip in the x and y directions due to synchronization error is given by:

$$\Delta XS(y) \text{ dynamic slip in the x direction} = INT\{dys*w(ys)*\Delta X(y-ys)\} / INT\{dys*w(ys)\} \quad \text{eq.3j}$$

$$\Delta YS(y) = \text{dynamic slip in the y direction} = INT\{dys*w(ys)*\Delta Y(y-ys)\} / INT\{dys*w(ys)\} \quad \text{eq.3k}$$

the dynamic yaw or rotational error due to synchronization error is given by;

$$d\Delta YS(y)/dx = \text{dynamic yaw} = INT\{dys*w(ys)*\theta s(ys))\} / INT\{dys*w(ys)\} \quad \text{eq.3l}$$

The influence of the dynamic lens distortions on the intra-field error, ($\Delta xL$, $\Delta yL$), is given by;

$$\Delta xL(y) = \text{dynamic lens distortion in the } x \text{ direction} = INT\{dys*w(ys)*\Delta Xsl(y-ys)\} / INT\{dys*w(ys)\} \quad \text{eq.3m}$$

$$\Delta yL(y) = \text{dynamic lens distortion in the } y \text{ direction} = INT\{dys*w(ys)*\Delta Ysl(y-ys)\} / INT\{dys*w(ys)\} \quad \text{eq.3n}$$

The interpretation of the structure of the intra-field distortion, ($\Delta XF$, $\Delta YF$), can be explained with reference to Equation 3g). In Equation 3g the intra-field distortion is divided into a contribution by the dynamic lens distortion, ($\Delta xL$, $\Delta yL$), that depends only on the cross scan coordinate, x, and is independent of the position along the scanning direction, y. From equations 3m and 3n, the dynamic lens distortion is a weighted average of the static lens distortion where the weighting factor, w(y), depends on the intensity distribution in the scan direction, y, possibly the photoresist process, and the scanning direction. Because the dynamic lens distortion contains none of the effects of scanning synchronization errors and only effects that are highly repeatable, the dynamic lens distortion will not vary from scan to scan. Thus, the contribution of dynamic lens distortion to the intra-field distortion can be some arbitrary set of vector displacements along a single scan row but will be the same for all rows in the scan as shown in FIG. 31.

The other contributor to intra-field distortion in equation 3g is the dynamic slip and yaw errors, $\square XS(y)$, $\square YS(y)$, $d\square YS(y)/dx$, which depend only on the position along the scanning direction, y, and are independent of the cross scan coordinate, x. From equations 3j, 3k, 3l the dynamic slip and yaw are convolutions of the weighting factor w(y) with the instantaneous translational and yaw offsets. Because dynamic slip and yaw contain nothing but the effects of scanner synchronization error, they will contain both repeatable parts that do not vary from scan to scan and non-repeatable parts that vary from scan to scan. Referring to FIGS. 32, 33 and 34, each row of the scan will have different translation and rotation errors that are generally different and strongly correlated only over distances ~SH, the slot height.

Thus; in the presence of both lens distortion and scanner synchronization error the total overlay distortion error, [$\delta X(x,y)$, $\delta Y(x,y)$] can be expressed in the following form;

$$\delta X(x,y) = \Delta XS(y) + \Delta xL(x), \quad \text{eq.12}$$

$$\delta Y(x,y) = \Delta YS(y) + \Delta yL(x) - x*d\Delta YS(y)/dx \quad \text{eq.13}$$

For example, in acid catalyzed photoresists such as those used for KrF or 248 nm lithography, the weighting function will typically be directly proportional to the intensity of light, I(y), across the slot since the latent acid image does not saturate until at very high exposure doses. However, in typical I-line photoresists the latent image saturates at normal exposure doses. This means that at a given location on the photoresist, the exposing light that first impinges consumes a larger portion of the photoactive material than an equal amount of exposing light impinging at a later time. Thus the w(y) will not be proportional to I(y) any longer. Because of this saturation effect, the weighting function will depend not only on the photoresist exposure dose used but also on the scanning direction (positive y or negative y).

Figures 2A, 2B:
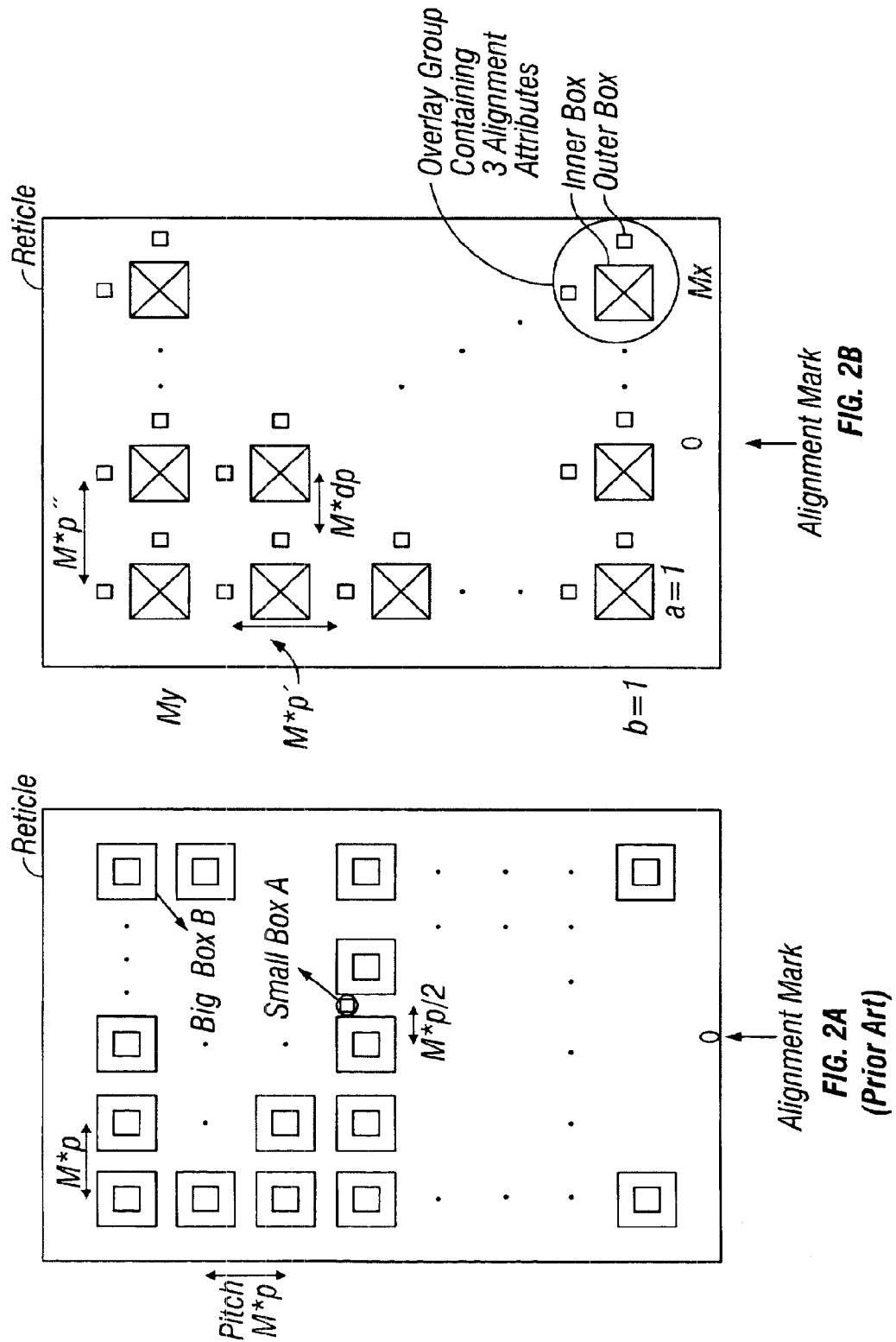
FIG. 2a shows a schematic of a typical reticle used to calculate stage metered scan and lens distortion.
FIG. 2b shows a reticle schematic for the preferred embodiment for use with photolithographic scanners.
Figure 12:
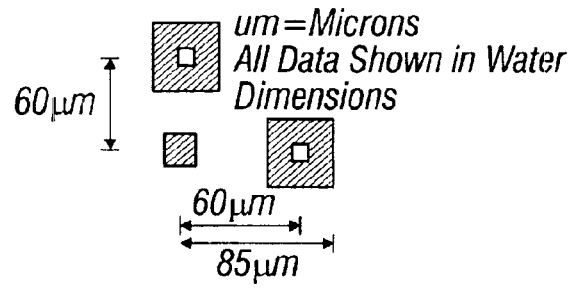
FIG. 12 shows an illustration of the 4XOL reticle alignment attributes as projected onto a photoresist coated wafer.
Figure 16:
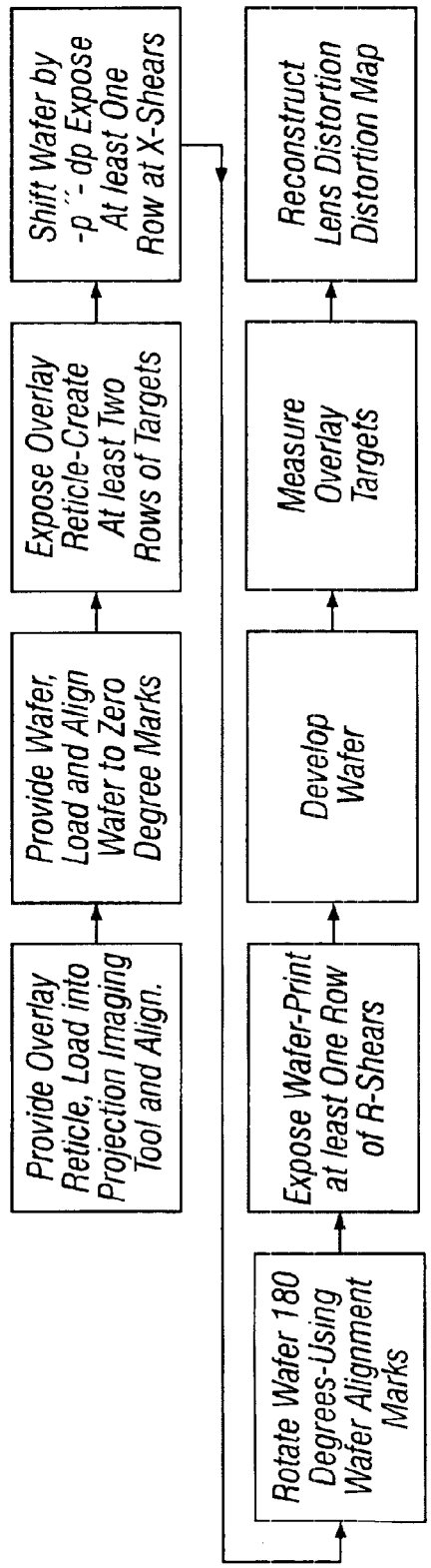
FIG. 16 illustrates a method of extracting intra-field lens distortion for scanners in terms of a flow diagram.
Figure 17:
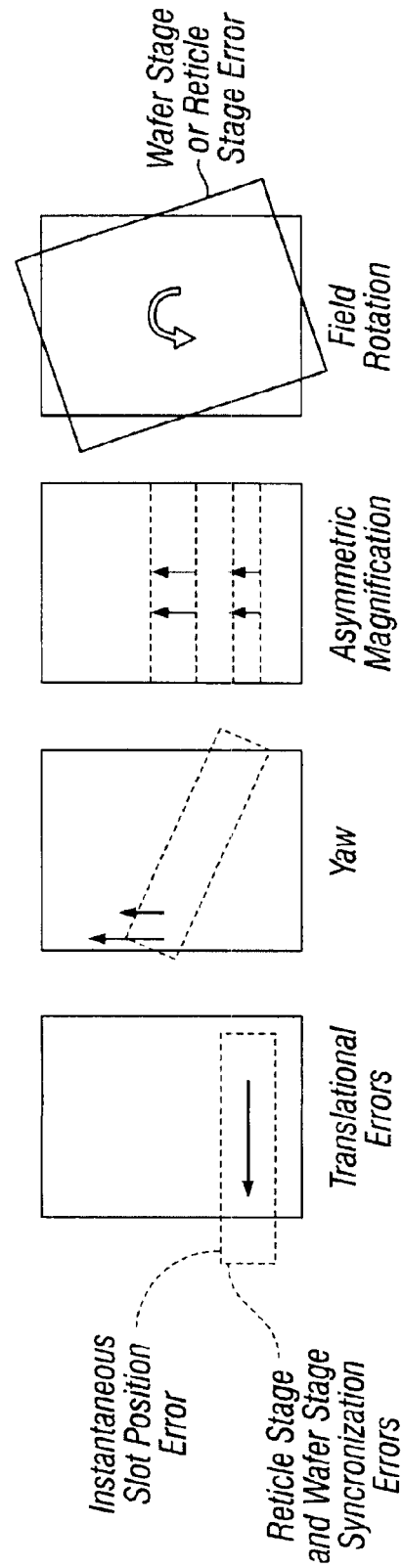
FIG. 17 shows typical scanner intra-field and inter-field overlay error components and common causes.
Figure 25:
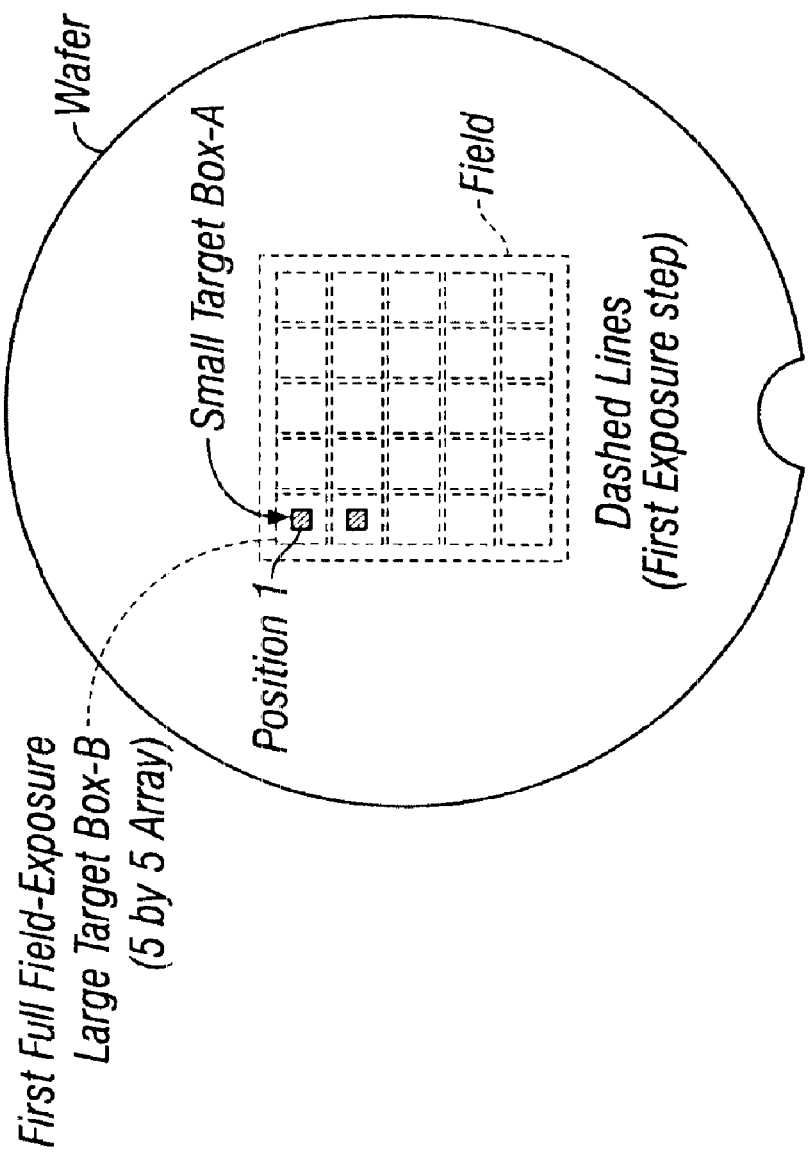
FIG. 25 shows a typical exposure pattern for a prior art lens distortion test.
Figure 27:
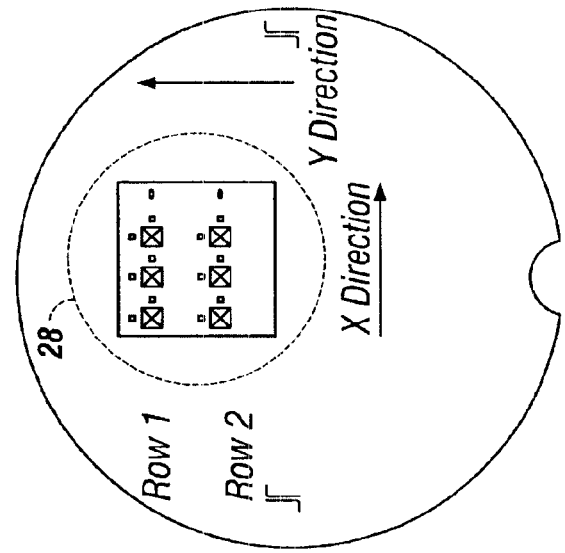
FIG. 27 shows the first exposure pattern for the preferred embodiment using the overlay reticle (FIG. 21).
Figure 30:
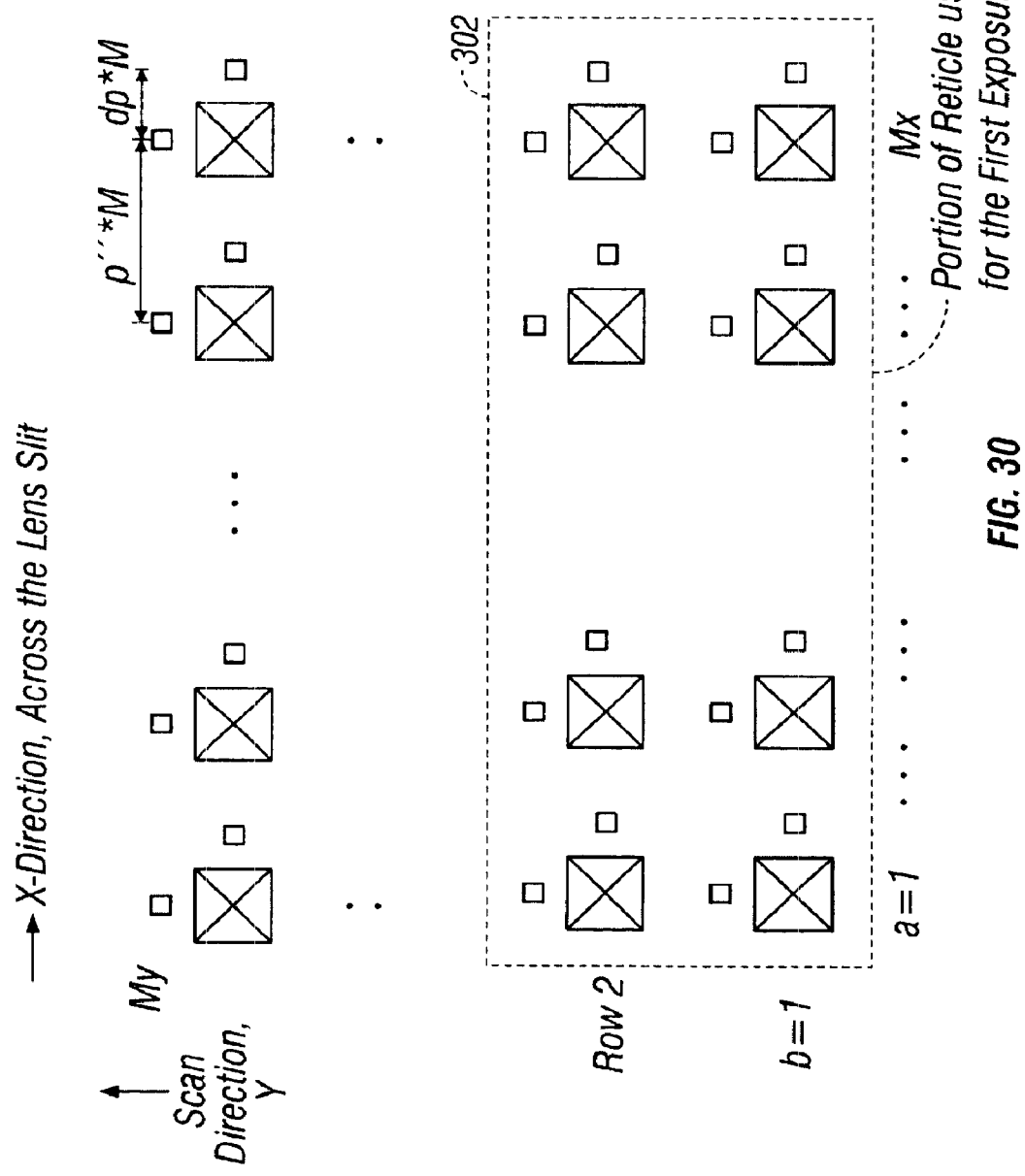
FIG. 30 illustrates the minimal sampling plan for determining the lens distortion associated with a scanner system.

A method for determining the overlay error associated with lens distortion to within a translation, rotation, and x-scale factor in the presence of scanner synchronization error is described See FIG. 16, beginning with a general overview of one embodiment and the mathematical details of the operation. First, as shown in FIG. 2*b*, a reticle with an (Mx×My) array of overlay groups containing alignment attributes (also called a 4XOL reticle) is loaded into a photolithographic scanner and aligned. Next, a photoresist coated wafer, for example, a positive chemically amplified resist or CAR, is loaded into the machine and aligned with the scanning alignment system. The computer that controls the operation of the machine is programmed to perform a sequence of three unique exposures. Although a full sized reticle is loaded into the scanner the actual size of the exposure field can be varied, as illustrated in FIG. 18, by adjusting the reticle blades such that only a portion of the reticle is exposed at any given time. As described in the mathematics below the actual size of the first scanned exposure field or the number of alignment groups actually printed on the wafer determines the overall accuracy of the lens distortion calculation. FIG. 30 illustrates a region that illustrates a minimal sampling plan for the first exposure of this embodiment; consisting of at least two rows (FIG. 27) (an Mx×2 array) of alignment attributes. FIG. 27 illustrates details of an Mx×2 array.

Following the first exposure the wafer is shifted or sheared (−p″−dp) in the x direction and a second exposure (X-shear exposure) of the reticle is performed. FIGS. 2*b*, 21, 22, 24, 25, 28, and 29 illustrate details of the first and second exposure on to the wafer. Typical values for "p" are in the range of about 0.5 mm to about 10 mm. Typical values for dp are about 0.02 mm to about 1 mm. The value of "p" is selected such that it be small enough to provide detailed enough coverage of the lens distortion pattern. Stated differently, the lens distortion needs to be sampled at a fine enough interval such that the distortions at the unmeasured locations in between the overlay groups are reasonably approximated (error less than about 30% maximum distortion) by interpolating the values of lens distortion measured on pitch "p". The value of offset dp is selected such that it lies within an area where the lens distortion is not varying significantly. Stated differently, the overlay group of FIG. 23 should lie within an isoplanatic distortion patch of the lens, herein defined as being a region over which the lens distortion varies by less than about 5% of the maximum value of the lens distortion.

Figure 13:
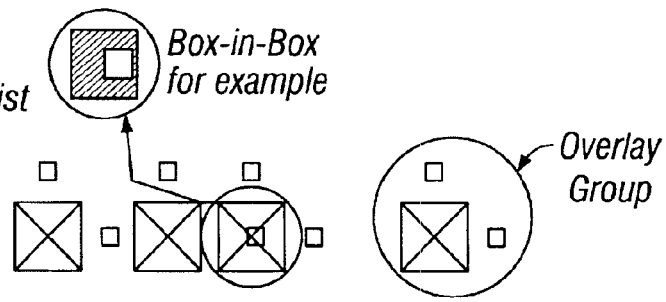
FIG. 13 shows a schematic of X-shear overlay on wafer.
Figure 14A:
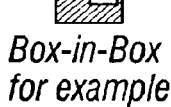
FIG. 14a shows a schematic of a 180 degree R-shear overlay on wafer.
Figure 14B:
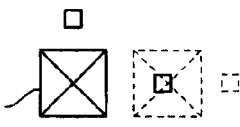
FIG. 14b shows a schematic of a 90 degree R-shear overlap on wafer.
Figure 28:
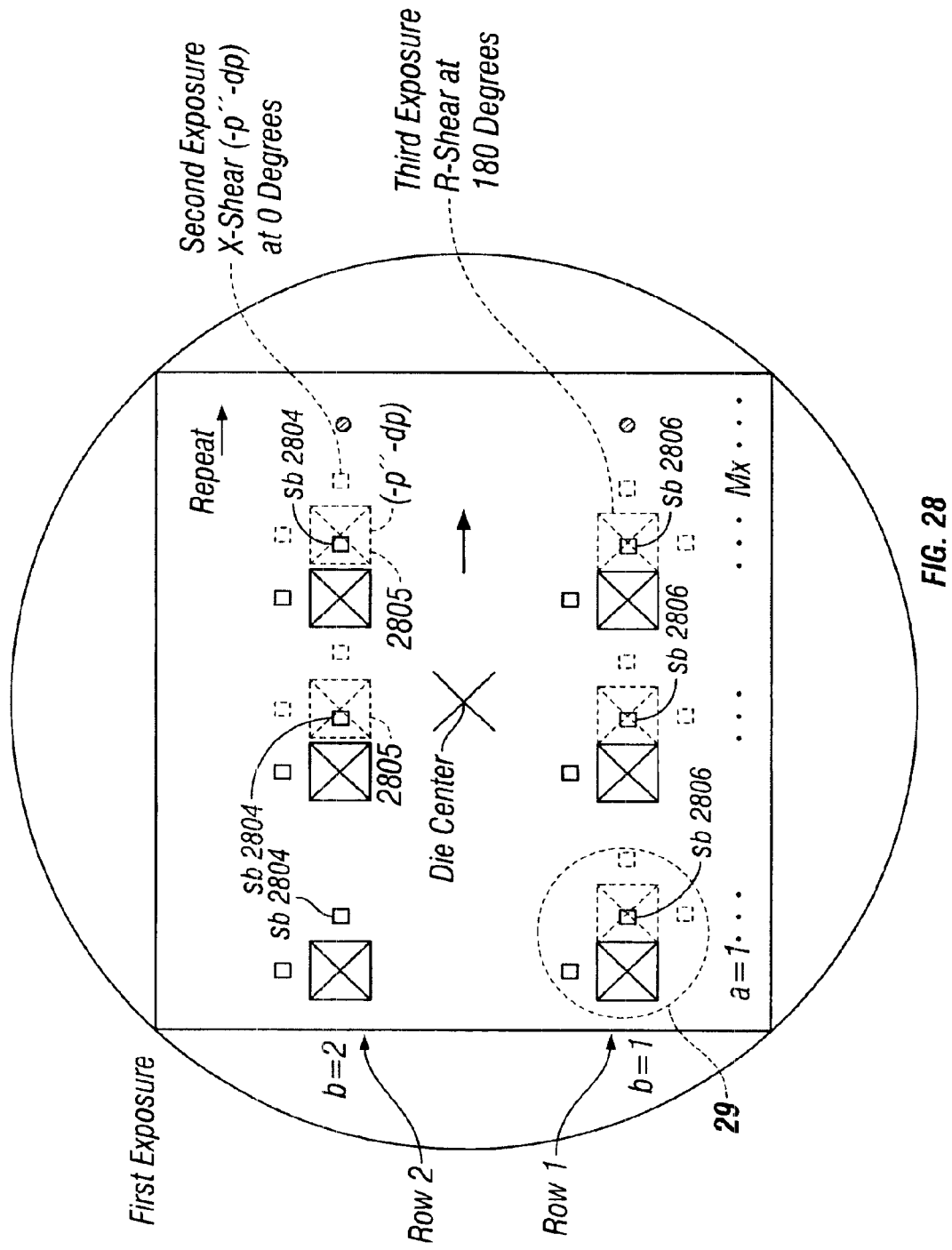
FIG. 28 shows a detailed view of the final two exposure patterns (X-shear, R-shear) for the preferred embodiment.

The number of rows of alignment attributes exposed during the second or X-shear exposure is typically half of the number of rows exposed during the first exposure. FIG. 28 shows an example of this at row 2. FIG. 13 show the resulting overlapping alignment attributes for a typical 1-row X-shear exposure sequence.

Figure 26:
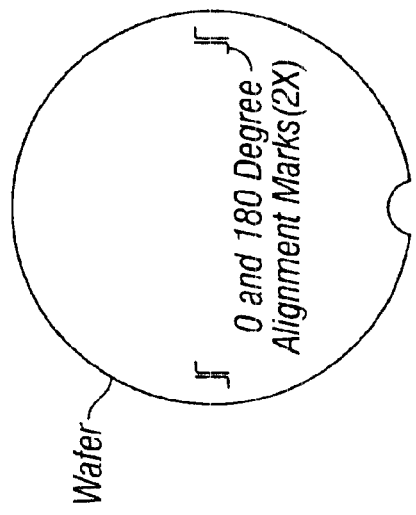
FIG. 26 shows a wafer with alignment marks at 0 and 180 degrees for use with the preferred embodiment.
Figure 29:
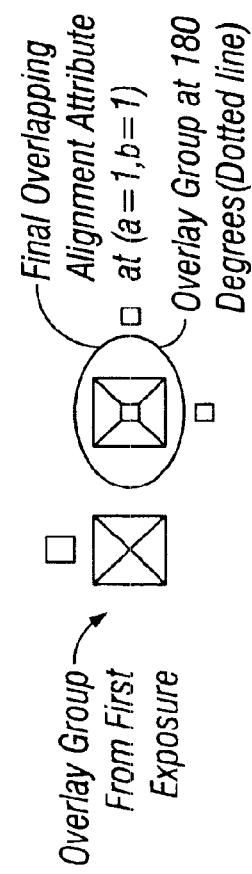
FIG. 29 shows a close-up view of overlay groups used for the third exposure of the preferred embodiment.

The final or third exposure sequence (R-shear exposure) consists of rotating the wafer 180-degrees, possibly using wafer alignment marks that have been rotated by 180 degrees, as illustrated in FIG. 26, and exposing the remaining rows, for example row 1 in FIG. 28. This creates a completed alignment attributes as shown in FIG. 28 row 1 and FIG. 14*a*. The number of rows of alignment attributes for this final R-shear exposure typically consists of half the number of rows exposed during the first exposure. Again, while two rows of alignment attributes are used to describe the method of this embodiment, depending on the further application of the resulting reconstructions, anywhere from the 2 rows illustrated here to all My reticle rows will be printed.

The wafer is then developed. Finally, an overlay metrology tool is used to determine the positional offset error for each overlapping overlay target or alignment attribute. A software algorithm is then used to calculate the lens distortion overlay components independent from the effects of the scanning dynamics the result being a table, such as illustrated in FIG. 37, consisting of the lens distortion as a function of the cross scan (xfn) position.

The mathematical operation for extraction of the distortion components is now described. As noted, overlay error manifests itself as translational offset of the nominal alignment attributes as shown in FIG. 6; by printing arrays of alignment attributes in the method just described it is possible to calculate the contribution of lens distortion in the presence of scanner synchronization error within a translation, rotation, and scale factor.

Equations 12 and 13 above show that the overall overlay distortion error (for each alignment attribute) in the presence of scanner synchronization error and lens distortion is the sum of two vector parts:

$$\delta X(xfn,y) = \Delta XS(yfn) + \Delta xL(xfn), \qquad \text{eq.13a}$$

$$\delta Y(xfn,yfn) = \Delta YS(yfn) + \Delta yL(xfn) - \Delta YR(xfn,yfn) \qquad \text{eq.13b}$$

Where (xfn, yfn) replace (x,y) as the nominal field position of each individual alignment attribute, See FIG. 1*a*. Also, $\Delta XS(yfn)$, $\Delta YS(yfn)$, represent the integrated average translational error associated with the scanning dynamics, $\Delta xL(xfn)$, $\Delta yL(xfn)$, represent the translational error associated with lens distortion and $\Delta YR(xfn,yfn)$ represents the integrated scanning average Yaw error ($\Delta YR(xfn,yfn) = xfn \ast [d\Delta YS(yfn)/dxfn] = xfn \ast [\theta avg(yfn)]$).

The equations for the locations of the 2*(Mx×2) inner and outer boxes overlay target boxes following the complete exposure and development sequence are now expressed. The field indices for the alignment attributes are shown in detail in FIGS. 24 and 30. It should be noted that each group of alignment attributes on the reticle consists of three box-in-box structures, as shown in FIG. 2*b*, and is identified by its row (b=1;My) and column (a=1;Mx) number (group coordinate). After the alignment attributes are printed on the wafer only one overlapping overlay target is created for any given group (See FIG. 13), that can be identified by a unique field position as discussed below.

The positions of the (Mx×2) small outer boxes associated with the first exposure sequence (See small box 2804 of FIG. 28), relative to their nominal positions (xfn,yfn) can be written as a sum of lens distortion, dynamic scanning error, wafer rotation, and wafer translational error;

Row 1 position, 1$^{st}$ exposure=[$T1x - \theta 1 \ast yfn + \Delta xL(xfn) + \Delta XS(yfn)$], [$T1y + \theta 1 \ast xfn + \Delta yL(xfn) + \Delta YS(yfn) + xfn \ast \theta avg(yfn)$] eq.14)

Row 2 position, 1$^{st}$ exposure=[$T1x - \theta 1 \ast yfn' + \Delta xL(xfn) + \Delta XS(yfn')$], [$T1y + \theta 1 \ast xfn + \Delta yL(xfn) + \Delta YS(yfn') + xfn \ast \theta avg(yfn')$] eq.15)

Where T1x and T1y are unknown field translations and □ an unknown field rotation. Note: the single prime symbol "'" highlights the fact that the scanning error in row 2 is different from row 1.

The positions of the (Mx×1) large inner boxes associated with the second X-shear is exposure sequence, illustrated in FIG. 28 row 2 dashed boxes 2805, relative to their nominal positions (xfn,yfn) can be written as a sum of errors as before;

Row 2 position, 2$^{nd}$ or X-shifted exposure=[$T2x - \theta 2 \ast yfn' + \Delta xL(xfn - \Delta) + \Delta XS2(yfn')$], [$T2y + \theta 2 \ast xfn + \Delta yL(xfn - \Delta) + \Delta YS2(yfn') + xfn \ast \theta avg2(yfn')$] eq. 16)

Where T2x and T2y are unknown field translations, θ2 an unknown rotation, $\Delta = (-p'')$, (See FIG. 28), and the dynamic scan induced error terms ($\Delta XS2$, $\Delta YS2$, θavg2) are distinctly different from those of the $1^{st}$ exposure and this is denoted by their suffix, 2.

The positions of the (M×x1) large inner boxes associated with the third R-shear exposure sequence, illustrated in FIG. 28 row 1, dashed boxes 2806, relative to their nominal positions (xfn,yfn) can be written as a sum of errors as before:

Row 1 position, $3^{rd}$ or 180 degree rotated exposure=$[T3x-\theta 3*yfn-\Delta xL(-xfn)+\Delta XS3(yfn)]$, $[T3y+\theta 3*xfn-\Delta yL(-xfn)+\Delta YS3(yfn)+xfn*\theta avg3(yfn)]$     eq.17)

Where T3x and T3y are unknown field translations, θ3 an unknown rotation, and the dynamic scan induced error terms (ΔXS3, ΔYS3, θavg3) are distinctly different from those of the $1^{st}$ and $2^{nd}$ exposures and this is denoted by their suffix, 3.

Finally, the measured offsets for the X-shear exposure is just the difference of equations 16 and 14 or:

$$BBX(a,2,X)=[(T2x-T1x+\Delta XS2(yfn')-\Delta XS(yfn'))-(\theta 2-\theta 1)*yfn'+\Delta xL(xfn-\Delta)-\Delta xL(xfn)] \quad \text{eq.18)}$$

$$BBY(a,2,X)=[(T2y-T1y+\Delta YS2(yfn')-\Delta YS(yfn'))+(\theta 2-\theta 1+\theta avg2(yfn')-\theta avg(yfn'))*xfn+\Delta yL(xfn-\Delta)-\Delta yL(xfn)] \quad \text{eq.19)}$$

Where we use BBX(a,2,X) and BBY(a,2,X) to denote the X-shear overlay error for the overlapping alignment attributes Box-in-Box structures) located at (a,b=2) or row 2 of FIG. 28.

The measured offsets for the R-shear exposures (the difference between the large boxes in row 1 from the R-shear exposure and the small boxes in row 1 from the first exposure)=eq. 17–eq. 15 or;

$$BBX(a,1,R)=[(T3x-T1x+\Delta XS3(yfn)-\Delta XS(yfn))-(\theta 3-\theta 1)*yfn-\Delta xL(-xfn)-\Delta xL(xfn)]; \quad \text{eq.20)}$$

$$BBy(a,1,R)=[(T3y-T1y+\Delta YS3(yfn)-\Delta YS(yfh))+(\theta 3-\theta 1+\theta avg3(yfn)-\theta avg(yfn))*xfn-\Delta yL(-xfn)-\Delta yL(xfn)] \quad \text{eq.21)}$$

Where we use BBx(a,1,R) and BBy(a,1,R) to denote the R-shear overlay error for the overlapping alignment attributes (Box-in-Box structures) located at (a,b=1). See FIG. 28.

Equations 18–21 are typically solved using the singular value decomposition to produce the minimum length solution. See Numercal recipes, The Art of Scientific Computing, supra. They are typically over-determined in the sense of equation counting (there are more equations than unknowns) but are still singular in the mathematical sense; there is an ambiguity in the solution of these equations. The unknowns in Equations 18–21 are the intra-field distortion map ΔxL(xfn), ΔyL(xfn), all of the scanner dynamic and yaw errors (ΔXS(yfn),ΔYS(yfn),θavg(yfn))). (ΔXS2(yfn'), ΔYS2(yfn'),θavg2(yfn')), etc., and the field translations and rotations (T1x,T1y,θ1 . . . T3x,T3y,θ3) It can be mathematically shown that we can solve for the distortion map (ΔxL(xfn),ΔyL(xfn)) uniquely to within a translation, rotation, and x-scale factor.

From the X-shear overlay measurements alone, we can determine the lens distortion, ΔxL(xfn),ΔyL(xfn) to within:

$$\Delta xL(xfn)=A+B*xfn \quad \text{eq. 22)}$$

$$\Delta yL(xfn)=C+D*xfn+E*xfn^2 \quad \text{eq. 22a)}$$

where A, B, C, D, and E are unknown constants.

This follows from setting up the linear equations for each overlapping alignment attribute and solving an over-determined system of equations as noted above. By including the R-shear overlay measurements we eliminate some noise in the calculations (by including more data) and in addition E is determined. Hence by combining the X-shear and R-shear measurements we can determine the lens distortion to within:

$$\Delta xL(xfn)=A+B*xfn \quad \text{eq. 23)}$$

$$\Delta yL(xfn)=C+D*xfn \quad \text{eq. 23a)}$$

Interpretation of the Unknown Constants (A,C)=(x,y), the intra-field translation contribution due to the scanner projection lens. Because there is also a translational scanning error contribution it can be included with this unknown translational constant into the unknown scanning error (ΔXS(yfn),ΔYS(yfn)) which is disregarded for the purposes of this analysis. In addition, the wafer stage can also be the source of this error.

B=x–intra-field scale or magnification factor. This must be determined using other techniques, it remains unknown for the purposes of the present invention.

D=intra-field rotation. Since the Yaw term (ΔYR(xfn, yfn)=xfn*[dΔYS(yfn)/dx]=xfn*[θavg(yfn)]) also has a xfn term we can absorb this factor into the scanning yaw term. In addition, the wafer stage can also induce intra-field rotation errors.

Therefore, using the method of this embodiment we can uniquely determine the lens distortion components in the presence of scanning synchronization error within a translation, rotation and x-scale factor. The translation, rotation and x-scale must be determined otherwise. Having accomplished the last step in the process of this embodiment the final results of the intra-field lens distortion in the presence of scanner synchronization error can be recorded in tabular form as illustrated in FIG. 37.

Figure 21:
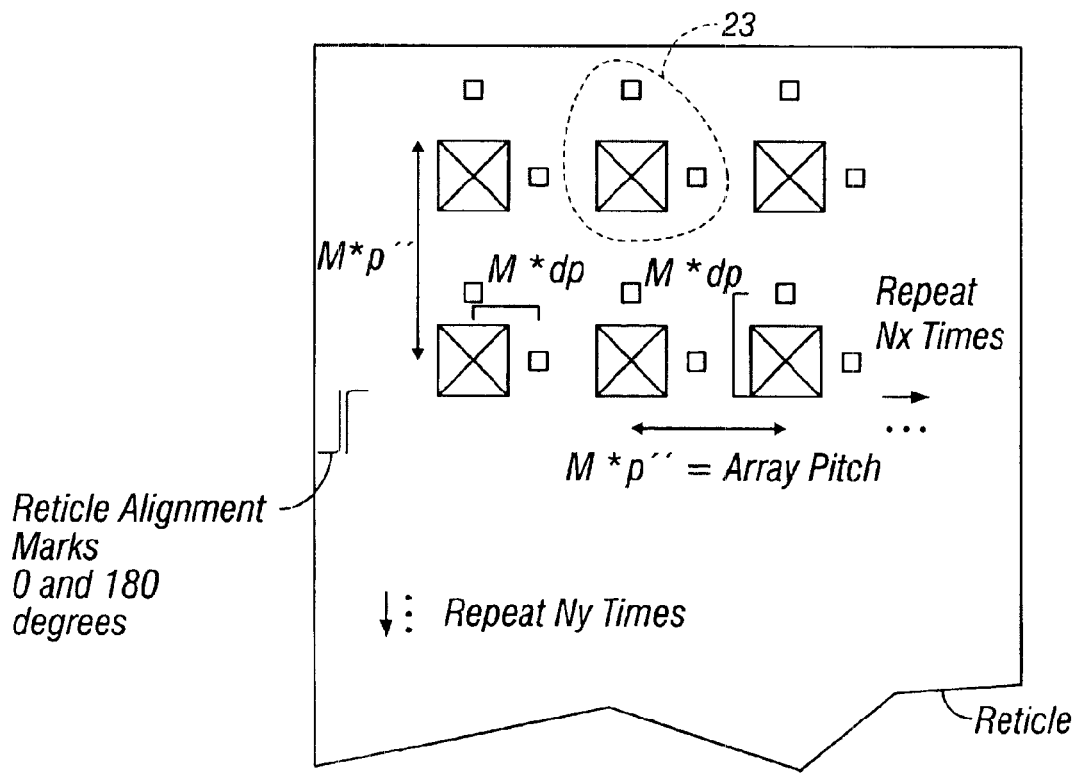
FIG. 21 shows a portion of the reticle for the preferred embodiment.

Reticle Plate:

A portion of the reticle plate for an embodiment is shown in FIG. 21. There are no strict requirements on the size of the reticle plate, the shape of the overlay target patterns or the types of materials used to fabricate the mask plate. Many different overlay target patterns are available. See Handbook of Microlithography and Microfabrication, supra; Direct-Referencing Automatic Two-Points Reticle-to-Wafer Alignment Using a Projection Column Servo System, M. Van den Brink et al., SPIE Vol. 633, Optical Microlithography V, 60:71, 1986. The embodiments described will work with any photolithographic scanner system using any type of optical overlay targets. The accuracy of the measurement technique does depend on the overlay sampling density and this should be considered. In the preceding discussion it was considered that the reticle creating the overlay patterns was perfect. In practice this is not true, but errors in the reticle manufacture can be taken into account by first measuring the position of all the individual structures in all of the overlay groups using an absolute metrology tool such as the Nikon 51, or Leica LMS 3200 series tools. Next, in formulating equations 18–21, reticle error (divided by the photolithographic exposure tool demagnification) is explicitly written out on the right hand side and then subtracted from the resulting overlay measurements on the left hand side of the equations (thereby canceling out on the right hand side). The result is Equations 18–21 as they are written above but with a correction applied to the overlay measurements appearing on the left hand side.

Figure 35:
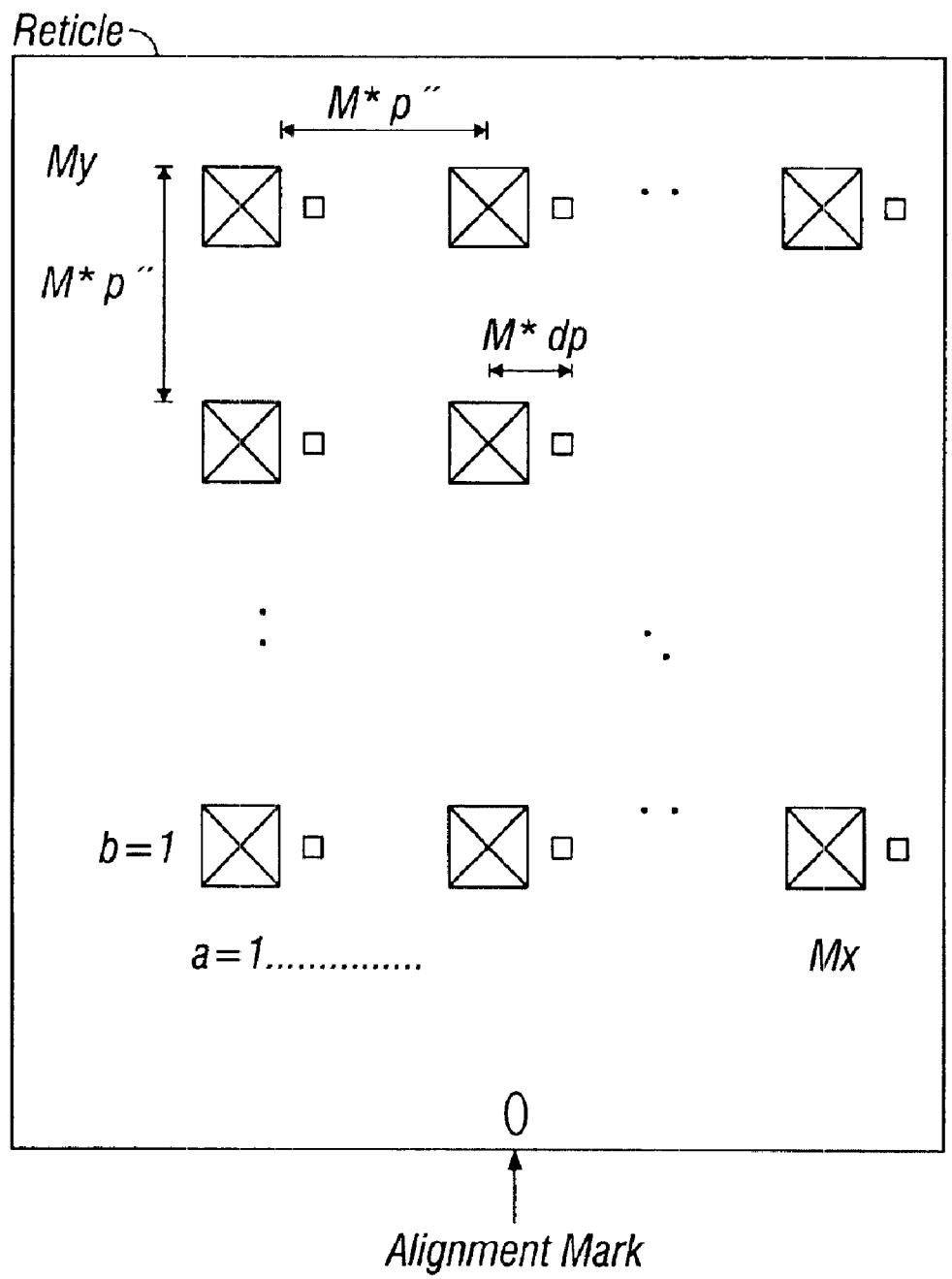
FIG. 35 and FIG. 36 shows an alternative set of reticles for the preferred methodology.

Alternative Embodiments:

In another embodiment, instead of the reticle illustrated in FIG. 21, a reticle layout as illustrated in FIG. 35 can be used.

Figure 36:
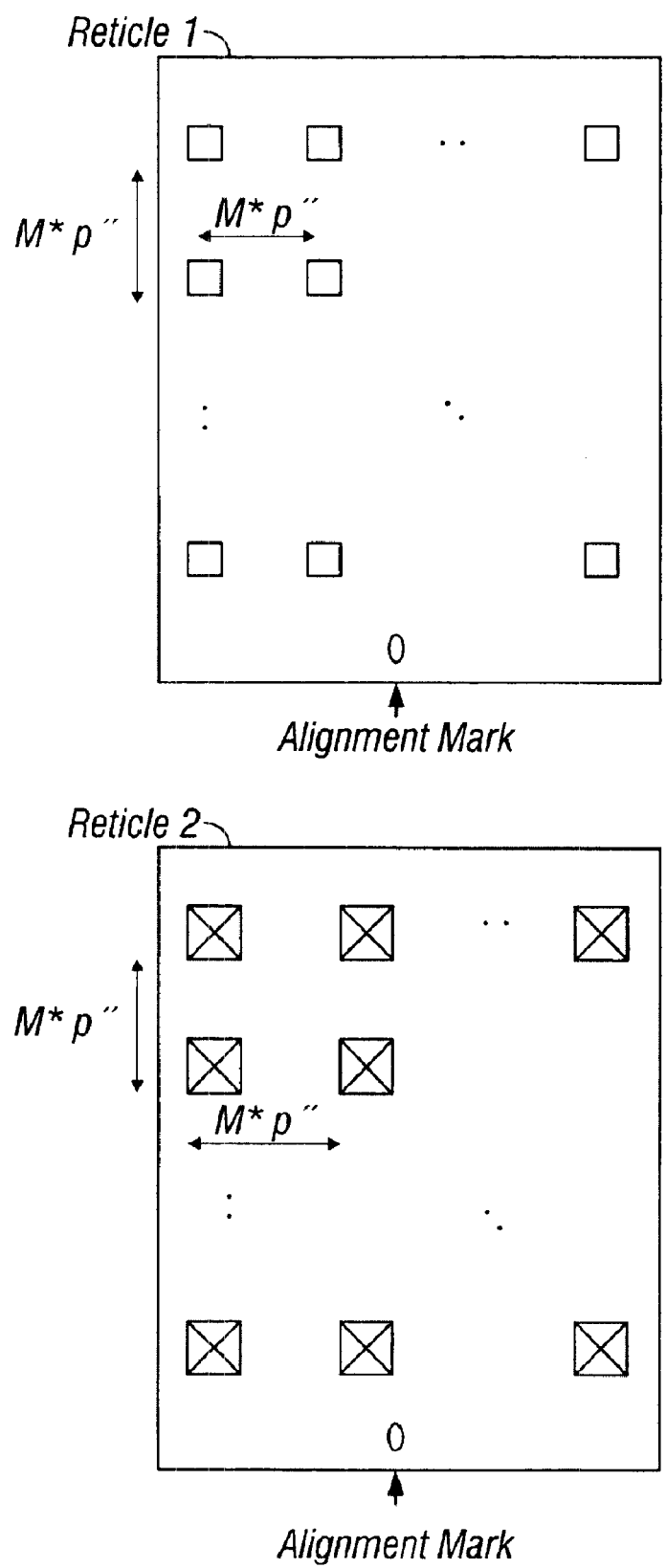

As illustrated in FIG. 35, each reticle set consists of an MxxMy array of alternating inner and outer box columns on regular pitch M*p". This reticle would be used in the same way as the reticle mentioned in the previous embodiment. Another variation of the reticle includes the double reticle set shown in FIG. 36. Each reticle consists of an MxxMy array of inner and outer box targets on regular pitch M*p". To use this reticle set, the photolithographic scanner is programmed to expose reticle 1 first and use reticle 2 for the final X and R shear exposures.

The reticles are typically made of glass with openings defined in a chrome coating. This is common for projection lithography tools utilized in semiconductor manufacture. The form the reticle can take will be determined by the format required by the specific projection lithography tool on which the reticle is loaded.

Overlay metrology tools utilized are typically conventional optical overlay tool such as those manufactured by KLA-Tencor (See KLA 5105 Overlay Brochure, KLA-Tencor; KLA 5200 Overlay Brochure, KLA-Tencor) or Bio-Rad Semiconductor Systems. See Quaestor Q7 Brochure, Bio-Rad Semiconductor Systems. Other optical overlay tools that can be used as well, include those described in Process for Measuring Overlay Misregistration During Semiconductor Wafer Fabrication, I. Mazor et al., U.S. Pat. No. 5,438,413, Aug. 1, 1995. In addition, some steppers or scanners (See Matching Management of Multiple Wafer Steppers Using a Stable Standard and a Matching Simulator, supra) can utilize their wafer alignment systems and wafer stages to function as overlay tools. However, the total size of the alignment attribute would be limited (consisting of 2 wafer alignment marks) to a distance over which the wafer stage would be as accurate as a conventional optical overlay tool. This distance is typically less than about 0.5 mm.

When electrical alignment attributes are used for overlay (See Matching Management of Multiple Wafer Steppers Using a Stable Standard and a Matching Simulator, supra; Automated Electrical Measurements of Registration Errors in Step and Repeat Optical Lithography Systems, supra; Capacitor Circuit Structure for Determining Overlay Error, supra), the overlay metrology tool utilized would correspond to the electrical equipment utilized for making the corresponding measurement.

The embodiments described above have been mainly described with respect to their application on projection imaging tools (scanners See Micrascan™ III Performance of a Third Generation, Catadioptric Step and Scan Lithographic Tool, D. Cote et al., SPIE Vol. 3051, 806:816, 1997; ArF Step and Scan Exposure System for 0.15 Micron and 0.13 Micron Technology Node; J. Mulkens et al., SPIE Conference on Optical Microlithography XII, 506:521, March 1999; 0.7 NA DUV Step and Scan System for 150 nm Imaging with Improved Overlay, J. V. Schoot, SPIE Vol. 3679, 448–463, 1999) commonly used in semiconductor manufacturing. The techniques and methods can be applied to other scanning projection tools such as; 2-dimensional scanners (See Large-area, High-Throughput, High-Resolution Projection Imaging System, K. Jain, U.S. Pat. No. 5,285,236, Feb. 8, 1994; Optical Lithography—Thirty Years and Three Orders of Magnitude, supra), office copy machines, and next generation lithography (ngl) systems such as XUV (See Development of XUV Projection Lithography at 60–80 nm, supra), SCALPEL, EUV (Extreme Ultra Violet) (See Reduction Imaging at 14 nm Using Multiplayer-Coated Optics: Printing of Features Smaller than 0.1 Micron, supra), IPL (Ion Projection Lithography), and EPL (electron projection lithography) See Mix-and-Match: A Necessary Choice, supra.

The techniques have been described with respect to the recording medium being positive photoresist. The techniques would work equally well with negative photoresist, providing appropriate adjustment to the box in box structures on the reticle are made. In general, the recording medium can be any recording media that is used on the lithographic projection tool being measuring. For example, on an EPL tool, an electron beam photoresist such as PMMA could be utilized as the recording medium.

In the embodiments above, the substrates on which the recording media is placed were described as wafers. This will be the case in semiconductor manufacture. The techniques described will work on other forms of substrate, with the exact form of the substrate dictated by the projection lithography tool and its use in a specific manufacturing environment. For example, in a flat panel manufacturing facility, the substrate on which the photoresist would be placed would be a glass plate or panel. A mask making tool would utilized a reticle as a substrate. Circuit boards or multi-chip module carriers are other possible substrates.

The present invention has been mainly described with respect to its application on the projection imaging tools (scanners (See Micrascan™ III Performance of a Third Generation, Catadioptric Step and Scan Lithographic Tool, D. Cote et al., SPIE Vol. 3051, 806:816, 1997; ArF Step and Scan Exposure System for 0.15 Micron and 0.13 Micron Technology Node, J. Mulkens et al., SPIE Conference on Optical Microlithography XII, 506:521, March 1999; 0.7 NA DUV Step and Scan System for 150 nm Imaging with Improved Overlay, J. V. Schoot, SPIE Vol. 3679, 448:463, 1999) commonly used in semiconductor manufacturing today. The methods of the present invention can be applied to other scanning projection tools such as; 2-dimensional scanners (See Large-Area, High-Throughput, High Resolution Projection Imaging System, Jain, U.S. Pat. No. 5,285, 236, Feb. 8, 1994; Optical Lithography—Thirty Years and Three Orders of Magnitude, supra), office copy machines, and next generation lithography (ngl) systems such as XUV (See Development of XUV Projection Lithography at 60–80 nm, B. Newnam et al., SPIE Vol. 1671, 419:436, 1992), SCALPEL, EUV (Extreme Ultra Violet) (See Reduction Imaging at 14 nm Using Multilayer-Coated Optics: Printing of Features Smaller than 0.1 Micron, J. Bjorkholm et al., Journal Vacuum Science and Technology, B 8(6),1509:1513, November/December 1990), IPL (Ion Projection Lithography), and EPL (electron projection lithography). See Mix-and Match: A Necessary Choice, supra.

The present invention has been mainly described with respect to the recording medium being positive photoresist. The present invention could equally well have used negative photoresist providing we make appropriate adjustment to the overlay groups on the reticle. In general, the recording medium is whatever is typically used on the lithographic projection tool we are measuring. Thus, on an EPL tool, an electron beam photoresist such as PMMA could be utilized as the recording medium.

So far, we have described the substrates on which the recording media is placed as wafers. This will be the case in semiconductor manufacture. The exact form of the substrate will be dictated by the projection lithography tool and its use in a specific manufacturing environment. Thus, in a flat panel manufacturing facility, the substrate on which the photoresist would be placed would be a glass plate or panel. A mask making tool would utilized a reticle as a substrate. Circuit boards or multi-chip module carriers other possible substrates.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes, which come with the meaning and range of equivalency of the claims, are to be embraced within their scope.

I claim:

1. A method of determining a scanning lens distortion in a projection imaging tool having a reticle, the method comprising:

exposing a reticle pattern onto a substrate having a recording media in a first position, wherein the reticle pattern includes at least two arrays of alignment attributes, the arrays of alignment attributes having features complementary to each other and the arrays have the same pitch and are offset from each other;

exposing the reticle pattern onto the substrate in a second position, wherein the reticle pattern in the second position overlaps the reticle pattern in the first position and is shifted in a direction perpendicular to a scanning direction by an amount that corresponds to the array offset;

rotating the substrate a desired angular amount and exposing the reticle pattern onto the substrate in a third position, wherein the reticle pattern in the third position overlaps the reticle pattern in the first position;

measuring positional offsets of the alignment attributes of the overlapped exposed patterns on the substrate; and determining a scanning lens distortion map from the positional offset measurements.

2. A method as defined in claim 1, wherein rotating the substrate a desired angular amount comprises rotating the substrate 180 degrees.

3. A method as defined in claim 1, wherein determining the scanning lens distortion comprises determining relative dynamics of motion between the substrate and the reticle.

4. A method as defined in claim 1, wherein the substrate is a semiconductor surface.

5. A method as defined in claim 1, wherein the substrate is a silicon wafer.

6. A method as defined in claim 1, wherein the substrate is a flat panel display.

7. A method as defined in claim 1, wherein the substrate is a reticle.

8. A method as defined in claim 1, wherein the substrate is a photolithographic mask.

9. A method as defined in claim 1, wherein the substrate is an electronic recording media.

10. A method as defined in claim 1, wherein the projection imaging tool is used in a photolithographic stepper system.

11. A method as defined in claim 1, wherein the projection imaging tool is used in a photolithographic scanner system.

12. A method as defined in claim 1, wherein the projection imaging tool is used in an electronic beam imaging system.

13. A method as defined in claim 1, wherein the projection imaging tool is used in an extreme ultra-violet photolithographic tool.

14. A method as defined in claim 1, wherein the projection imaging tool is used in a x-ray imaging system.

15. A method as defined in claim 1, wherein the recording media is a positive resist material.

16. A method as defined in claim 1, wherein the recording media is a negative resist material.

17. A method as defined in claim 1, wherein the recording media is an electronic CCD.

18. A method as defined in claim 1, wherein the recording media is a liquid crystal material.

19. A method as defined in claim 1, wherein the recording material is an optically sensitive material.

20. An apparatus for lithographic projection imaging, the apparatus comprising:

a projection lens;

a wafer stage that supports a substrate having a recording media;

exposure means for exposing a reticle pattern onto the substrate in a first position, wherein the reticle pattern includes at least two arrays of alignment attributes, the arrays of alignment attributes having features complementary to each other and the arrays have the same pitch and are offset from each other, and for exposing the reticle pattern onto the substrate in a second position, wherein the reticle pattern in the second position overlaps the reticle pattern in the first position and is shifted in a direction perpendicular to a scanning direction by an amount that corresponds to the array offset;

rotation means for rotating the substrate a desired angular amount after the exposure means exposes the reticle pattern onto the substrate in a third position, wherein such that the reticle pattern in the third position overlaps the reticle pattern in the first position;

measurement means for measuring positional offsets of the alignment attributes of the overlapped exposed patterns on the substrate; and mapping means for determining a scanning lens distortion map from the positional offset measurements.

21. A method of determining scanning lens distortion in a projection imaging system, the method comprising:

exposing a reticle pattern onto a substrate having a recording media in desired positions, wherein the reticle pattern is exposed in a first position, the substrate is shifted in a direction perpendicular to a scanning direction a desired amount, the reticle pattern is exposed in a second position, and the substrate is rotated 180 degrees and the reticle pattern is exposed a third time;

measuring positional offsets of alignment attributes included in the exposed reticle pattern; and determining a scanning lens distortion from the resulting positional offset.

22. A method of photolithographic scanning in a projection imaging system, the method comprising:

loading a wafer in the system for scanning; and scanning in accordance with scanning lens distortion determined by exposing a reticle pattern onto a substrate having a recording media in desired positions, wherein the reticle pattern is exposed in a first position, the substrate is shifted in a direction perpendicular to a scanning direction a desired amount, the reticle pattern is exposed in a second position, and the substrate is rotated 180 degrees and the reticle pattern is exposed a third time, measuring positional offsets of alignment attributes included in the exposed reticle pattern, and determining a scanning lens distortion from the resulting positional offset.

23. A method of semiconductor manufacturing in a photolithographic projection imaging system that performs photolithographic scanning, the method comprising:
- loading a wafer in the projection imaging system for scanning; and
- scanning in accordance with scanning lens distortion of a projection imaging tool of the projection imaging system, the imaging tool including a reticle, wherein the scanning lens distortion is determined by a method comprising:
  - exposing a reticle pattern onto a substrate having a recording media in a first position, wherein the reticle pattern includes at least two arrays of alignment attributes, the arrays of alignment attributes having features complementary to each other and the arrays have the same pitch and are offset from each other;
  - exposing the reticle pattern onto the substrate in a second position, wherein the reticle pattern in the second position overlaps the reticle pattern in the first position and is shifted in a direction perpendicular to a scanning direction by an amount that corresponds to the array offset;
  - rotating the substrate a desired angular amount and exposing the reticle pattern onto the substrate in a third position, wherein the reticle pattern in the third position overlaps the reticle pattern in the first position;
  - measuring positional offsets of the alignment attributes of the overlapped exposed patterns on the substrate; and
  - determining a scanning lens distortion map from the positional offset measurements.

24. A method as defined in claim 23, wherein rotating the substrate a desired angular amount comprises rotating the substrate 180 degrees.

25. A photolithographic scanner comprising:
- a light source;
- a projection lens;
- a wafer stage that supports a substrate having a recording media;
- exposure means for exposing a reticle pattern onto the substrate in a first position, wherein the reticle pattern includes at least two arrays of alignment attributes, the arrays of alignment attributes having features complementary to each other and the arrays have the same pitch and are offset from each other, and for exposing the reticle pattern onto the substrate in a second position, wherein the reticle pattern in the second position overlaps the reticle pattern in the first position and is shifted in a direction perpendicular to a scanning direction by an amount that corresponds to the array offset;
- rotation means for rotating the substrate a desired angular amount after the exposure means exposes the reticle pattern onto the substrate in a third position, such that the reticle pattern in the third position overlaps the reticle pattern in the first position;
- measurement means for measuring positional offsets of the alignment attributes of the overlapped exposed patterns on the substrate; and
- mapping means for determining a scanning lens distortion map from the positional offset measurements.

* * * * *

UNITED STATES PATENT AND TRADEMARK OFFICE
CERTIFICATE OF CORRECTION

PATENT NO. : 6,906,780 B1
DATED : June 14, 2005
INVENTOR(S) : Adlai Smith

It is certified that error appears in the above-identified patent and that said Letters Patent is hereby corrected as shown below:

Column 20,
Line 28, please delete "wherein".

Signed and Sealed this

Sixteenth Day of August, 2005

JON W. DUDAS
*Director of the United States Patent and Trademark Office*